US012324232B2

(12) United States Patent
Hsiao et al.

(10) Patent No.: US 12,324,232 B2
(45) Date of Patent: Jun. 3, 2025

(54) LINER STRUCTURES

(71) Applicant: Taiwan Semiconductor Manufacturing Co., Ltd., Hsin-Chu (TW)

(72) Inventors: Tsung-Chieh Hsiao, Changhua (TW); Johnson Chen, Hsinchu (TW); Tzung-Yi Tsai, Hsinchu (TW); Tsung-Lin Lee, Hsinchu (TW); Yen-Ming Chen, Hsin-Chu (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 506 days.

(21) Appl. No.: 17/872,348

(22) Filed: Jul. 25, 2022

(65) Prior Publication Data

US 2022/0359509 A1 Nov. 10, 2022

Related U.S. Application Data

(62) Division of application No. 16/938,580, filed on Jul. 24, 2020, now Pat. No. 11,437,372.

(60) Provisional application No. 62/906,513, filed on Sep. 26, 2019.

(51) Int. Cl.
| | |
|---|---|
| *H10D 84/83* | (2025.01) |
| *H01L 21/321* | (2006.01) |
| *H10D 30/01* | (2025.01) |
| *H10D 30/62* | (2025.01) |
| *H10D 84/01* | (2025.01) |
| *H10D 84/03* | (2025.01) |

(52) U.S. Cl.
CPC ....... *H10D 84/834* (2025.01); *H01L 21/3212* (2013.01); *H10D 30/0241* (2025.01); *H10D 30/6211* (2025.01); *H10D 84/0158* (2025.01); *H10D 84/038* (2025.01)

(58) Field of Classification Search
CPC ............ H10D 84/864; H10D 30/6211; H10D 30/0241; H10D 84/0158; H10D 84/038
See application file for complete search history.

(56) References Cited

U.S. PATENT DOCUMENTS

| | | | |
|---|---|---|---|
| 8,796,666 | B1 | 8/2014 | Huang et al. |
| 8,822,243 | B2 | 9/2014 | Yan et al. |
| 8,987,142 | B2 | 3/2015 | Lee et al. |

(Continued)

*Primary Examiner* — Christine A Enad
(74) *Attorney, Agent, or Firm* — HAYNES AND BOONE, LLP

(57) ABSTRACT

A semiconductor device includes a fin structure over a substrate. The fin structure includes a bottom portion and a top portion. The bottom and the top portions have different materials. The device also includes a liner layer on a sidewall of the bottom portion, a dielectric layer on side surfaces of the liner layer, an interfacial layer, and a gate structure over the dielectric layer and engages the fin structure. A top surface of the liner layer extends below a bottom surface of the top portion. The interfacial layer has a first section on and directly contacting sidewall surfaces of the bottom portion and a second section on and directly contacting top and sidewall surfaces of the top portion. The gate structure includes a high-k dielectric layer and a metal gate electrode over the high-k dielectric layer. The high-k dielectric layer directly contacts the first section of the interfacial layer.

20 Claims, 21 Drawing Sheets

(56) References Cited

U.S. PATENT DOCUMENTS

| | | |
|---|---|---|
| 9,093,530 B2 | 4/2015 | Huang et al. |
| 9,099,530 B2 | 8/2015 | Lin et al. |
| 9,053,279 B2 | 9/2015 | Chang et al. |
| 9,153,478 B2 | 10/2015 | Liu et al. |
| 9,501,601 B2 | 11/2016 | Chang et al. |
| 9,548,303 B2 | 1/2017 | Lee et al. |
| 9,876,114 B2 | 1/2018 | Jangjian et al. |
| 2013/0230953 A1* | 9/2013 | Sudo ............... H10D 30/0245 257/E21.409 |
| 2014/0117462 A1 | 5/2014 | Cheng et al. |
| 2015/0357443 A1 | 12/2015 | Ching et al. |
| 2016/0056277 A1 | 2/2016 | Lee et al. |
| 2016/0104776 A1 | 4/2016 | Ching et al. |
| 2016/0268260 A1 | 9/2016 | Lim et al. |
| 2017/0069630 A1 | 3/2017 | Cha et al. |
| 2018/0130800 A1 | 5/2018 | Huang et al. |
| 2018/0130802 A1* | 5/2018 | Wang ............... H10D 64/514 |
| 2019/0043857 A1* | 2/2019 | Wu ............... H10D 84/0158 |
| 2019/0067419 A1 | 2/2019 | Zhou |
| 2019/0131186 A1* | 5/2019 | Chung ............ H01L 21/823807 |
| 2021/0098451 A1* | 4/2021 | Hsiao ............... H01L 29/7854 |
| 2021/0343711 A1* | 11/2021 | Wu ............... H10D 84/0147 |

\* cited by examiner

LINER STRUCTURES

CROSS-REFERENCE TO RELATED APPLICATIONS

This application is a divisional application of U.S. application Ser. No. 16/938,580, filed Jul. 24, 2020, which claims priority to U.S. Provisional Patent Application Ser. No. 62/906,513, filed Sep. 26, 2019, each of which is herein incorporated by reference in its entirety.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. However, such scaling down has also been accompanied by increased complexity in design and manufacturing of devices incorporating these ICs, and, for these advances to be realized, similar developments in device fabrication are needed.

As geometry size of IC devices continues to shrink, maintaining device reliability and power efficiency has become ever more challenging. OFF-state current leakage is a major contributor to power inefficiencies and is often regarded as a limiting factor in future microprocessor integration. It has been found that p-type Fin Field Effect Transistors (FinFETs) that include liner layers based on silicon nitride ($SiN_x$) sometimes experience high OFF-state current leakages. Therefore, while the conventional liners and the processes of making thereof are adequate for their intended purposes, they are not satisfactory in all aspects.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
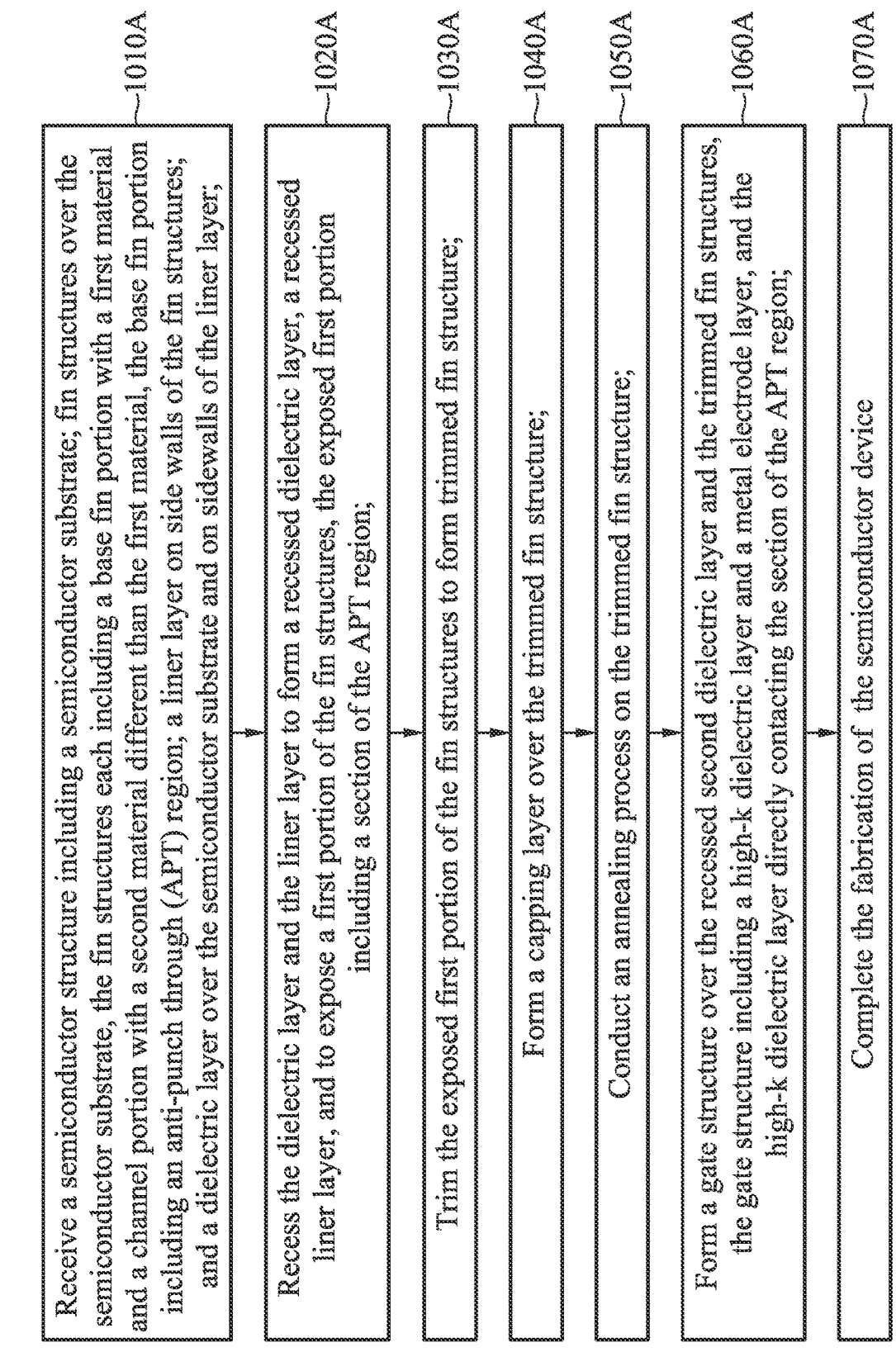
FIG. 1 is a flow chart of an example method for fabricating an embodiment of semiconductor devices of the present disclosure according to some embodiments of the present disclosure.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed interposing the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc., as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to ICs and semiconductor devices, as well as methods of forming the same. More specifically, the present disclosure is related to a new liner layer structure for semiconductor devices that improves device characteristics with respect to the OFF-state current leakage ($I_{OFF}$). Liner layers are used prevalently in semiconductor devices. They may be found, for example, surrounding fin structures, in contact openings, and between various gate layers. Liner layers may be used as barrier layers to prevent undesirable diffusions of materials across the liner layers; as glue layers to provide better adhesions between two layers on both sides of the liner layer that have very dissimilar material characteristics; or as spacer layers to provide proper electrical insulation across the liner layers. Commonly used liner layer materials include silicon dioxide ($SiO_2$), silicon nitride ($SiN_x$ such as $Si_3N_4$), metal oxide, metal nitrides, and combinations thereof. However, it has been found that some liner layers, such as silicon nitride liner layers and silicon dioxide-silicon nitride combination liner layers, will accrue positive charges (or "fixed charges") at the liner layer surfaces if directly contacting a gate structure. These positive charges impede the functioning of the anti-punch through (APT) regions and cause reduction in their effectiveness in mitigating OFF-state current leakages.

In that regard, an APT region is a portion of an active region formed below a transistor channel and has a concentration of dopants that is higher than the rest of the active region. For fin-like field effect transistors (FinFETs), the APT region may be a portion of the fin structure. An APT region in a p-type FinFET (pFET) may be doped with n-type dopants; and an APT region of an n-type FinFET (nFET) may be doped with p-type dopants. The APT regions are implemented to impede the problematic migrations of charge carriers in an OFF state (or the leakage current) from the drain depletion region to the source depletion region. When a liner layer adjacent to an APT region (for example, of a fin structure in a pFET) accrues large amount of fixed charges at its surface (for example, when it directly contacts a gate structure), electrons are retained during an operation cycle around the liner layer surface by electrostatic attractions to balance the charges. These additional electrons assert an electrostatic repulsion to the n-type dopants in the adjacent APT region. This causes a reduction in the effective dopant dosage of the APT regions, and thereby a reduction in their effectiveness. As a result, bottom leakage current in the OFF-state becomes more prominent. This effect is often manifested in an increase (or raise) in the magnitude of $I_{OFF}$ following an operation cycle. Under stress testing conditions the increase in $I_{OFF}$ following hot carrier injections (HCI) (a process simulating the operation condition) may be thousands of times higher than the $I_{OFF}$ before the HCI process. Embodiments of the present disclosure disclose methods of mitigating the effect of charge accumulations at the liner layer surfaces on the APT regions, thereby maintaining a low OFF-state current.

The disclosure may be used in any appropriate semiconductor devices implementing liner layers, such as in metal-oxide semiconductor field effect transistors (MOSFETs), complementary metal-oxide-semiconductor (CMOS) devices, p-type metal-oxide-semiconductor (pMOS) devices, n-type metal-oxide-semiconductor (nMOS) devices, FinFETs, Gate-All-Around (or Multi-Bridge-Channel) MOSFETs such as nanowire devices and nanosheet devices, and other multi-gate FETs. Person of ordinary skill in the art may recognize other examples of semiconductor devices that may benefit from the present disclosure. The semiconductor devices may be fabricated during processing of the IC, or a portion thereof, that may comprise static random access memory (SRAM) and/or logic circuits, passive components such as resistors, capacitors, and inductors, and active components such as pFETs, nFETs, FinFETs, MOSFETs, CMOS, bipolar transistors, high voltage transistors, high frequency transistors, other memory cells, and combinations thereof.

Figure 7A:
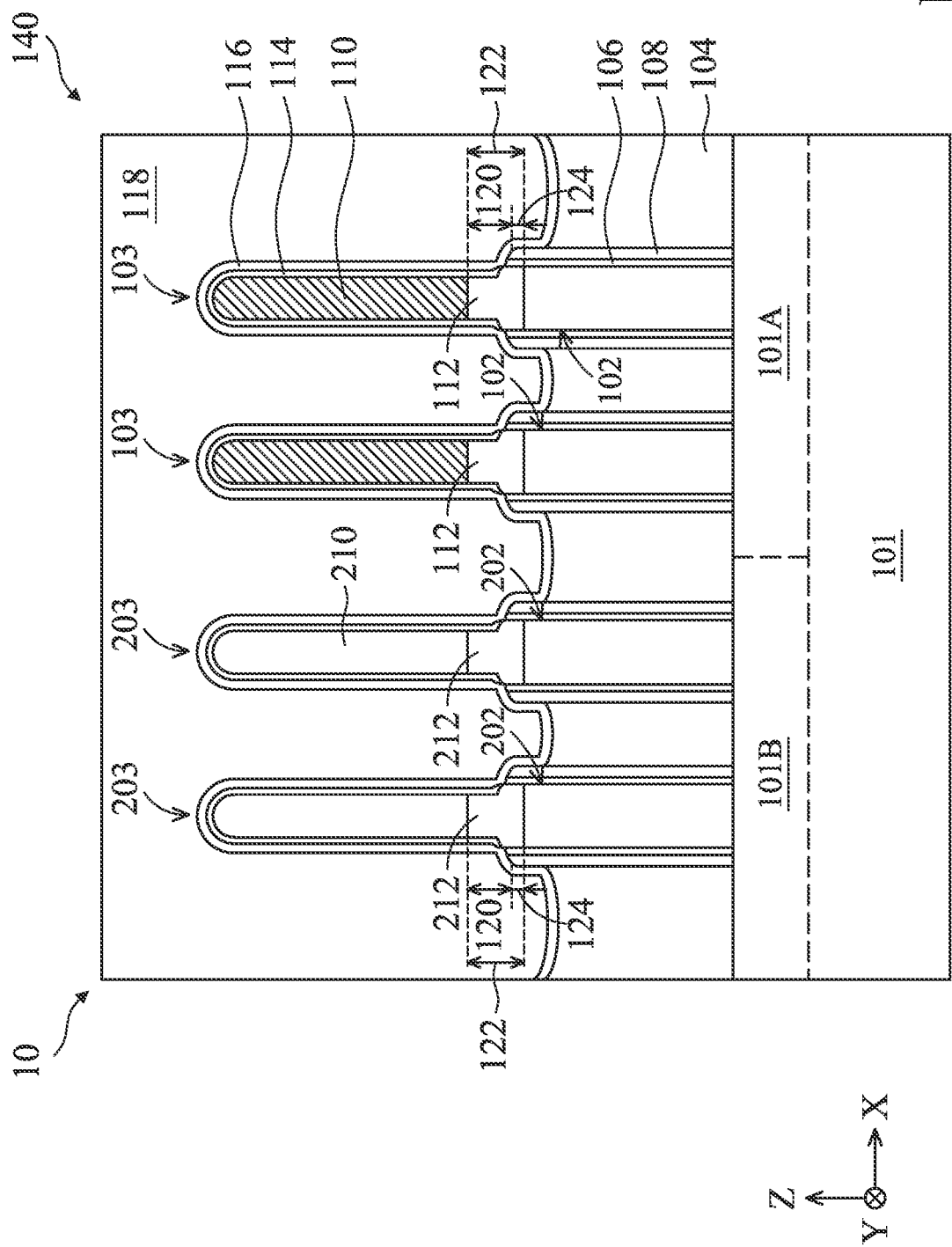
Figure 7B:
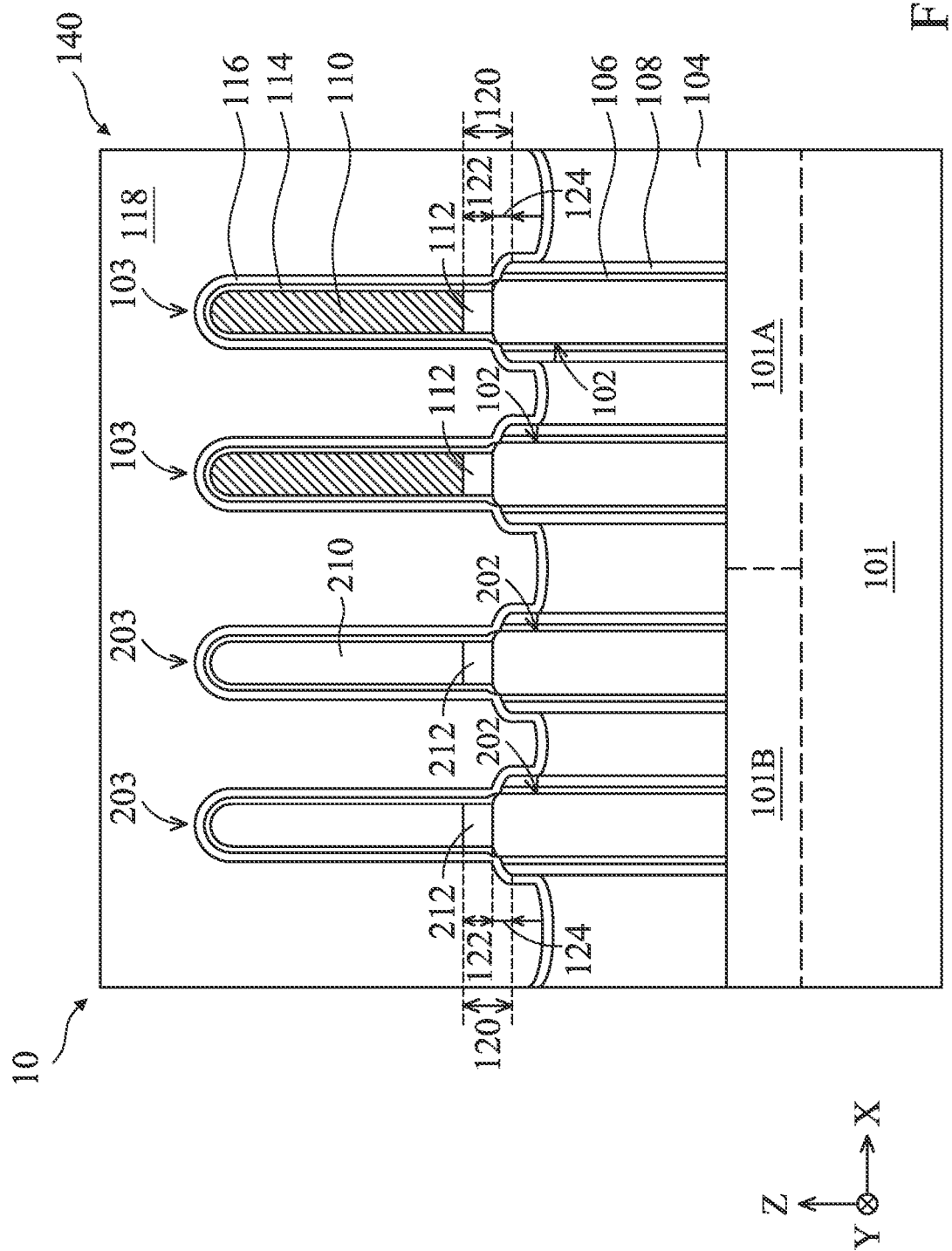
Figure 7C:
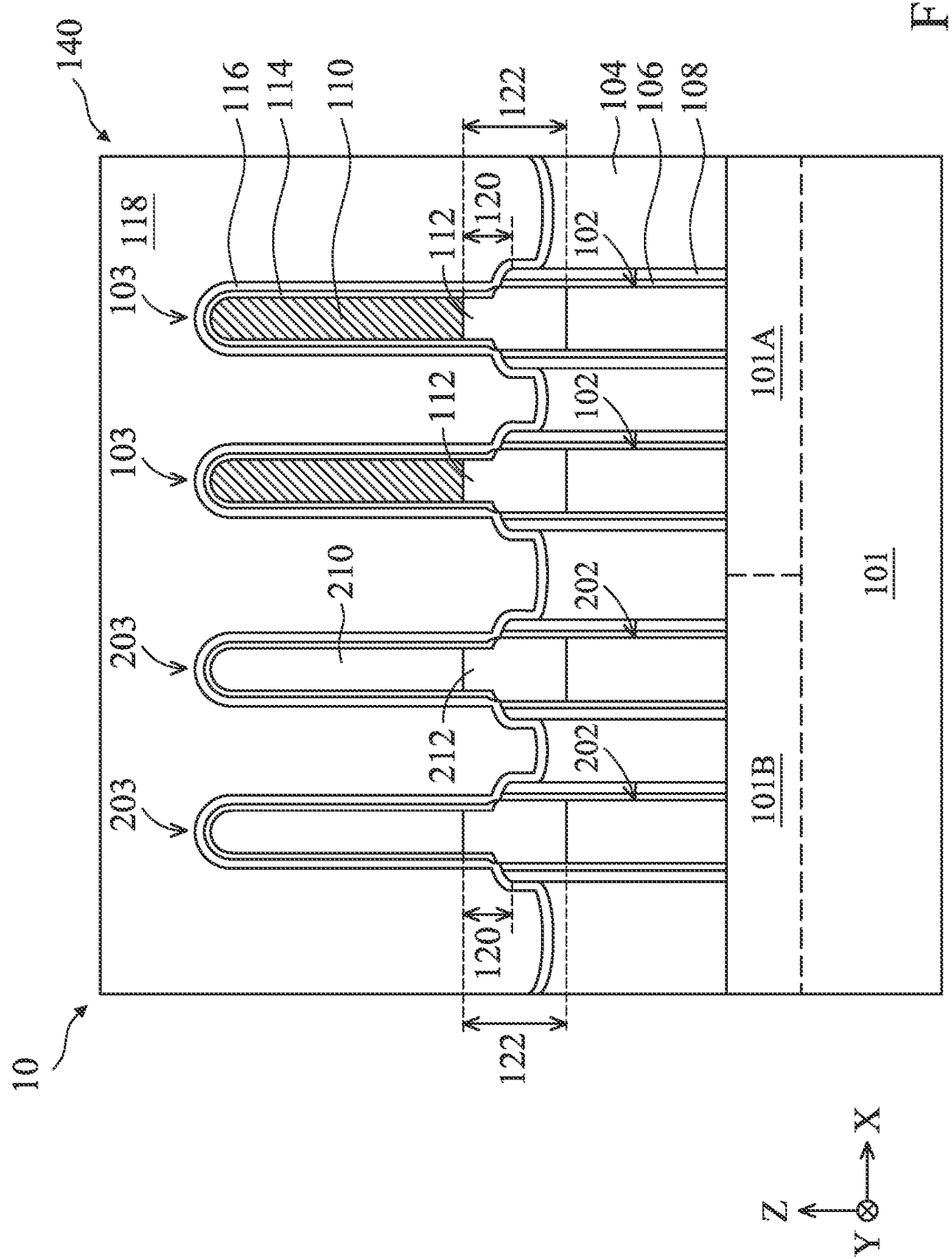
Figure 8A:
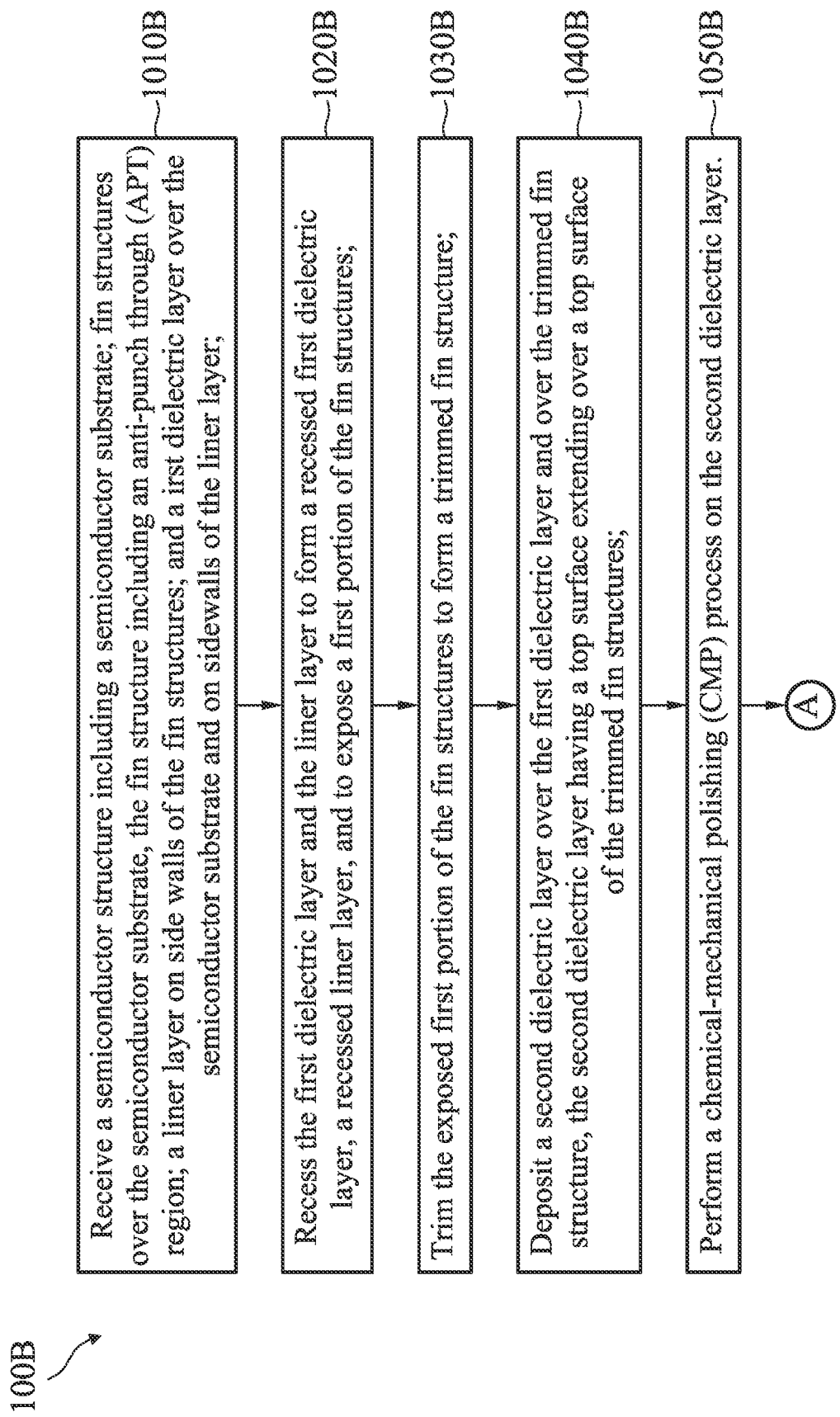
FIGS. 8A and 8B are a flow chart of an example method for fabricating an embodiment of semiconductor devices of the present disclosure according to some embodiments of the present disclosure.
Figure 8B:
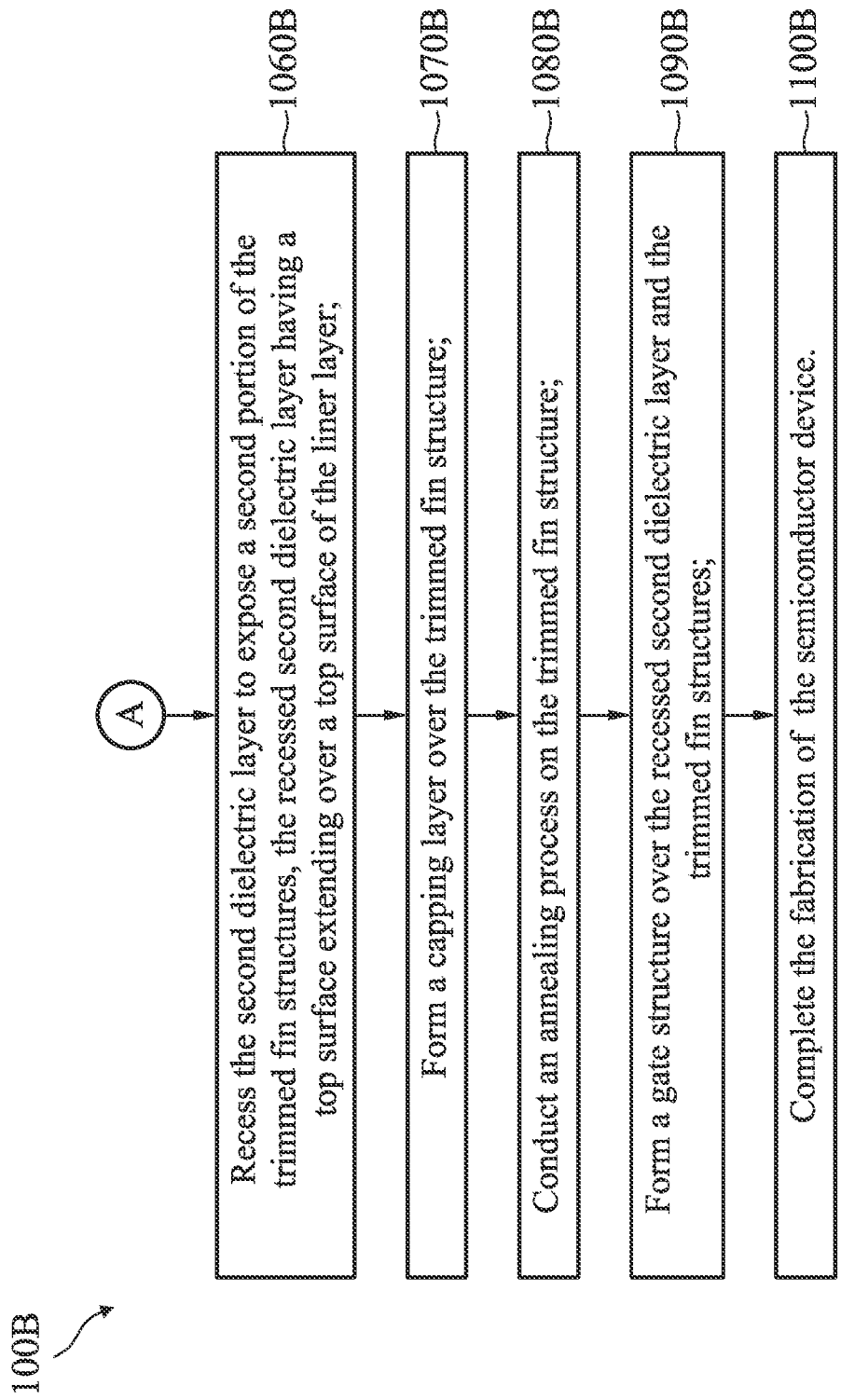
Figure 9:
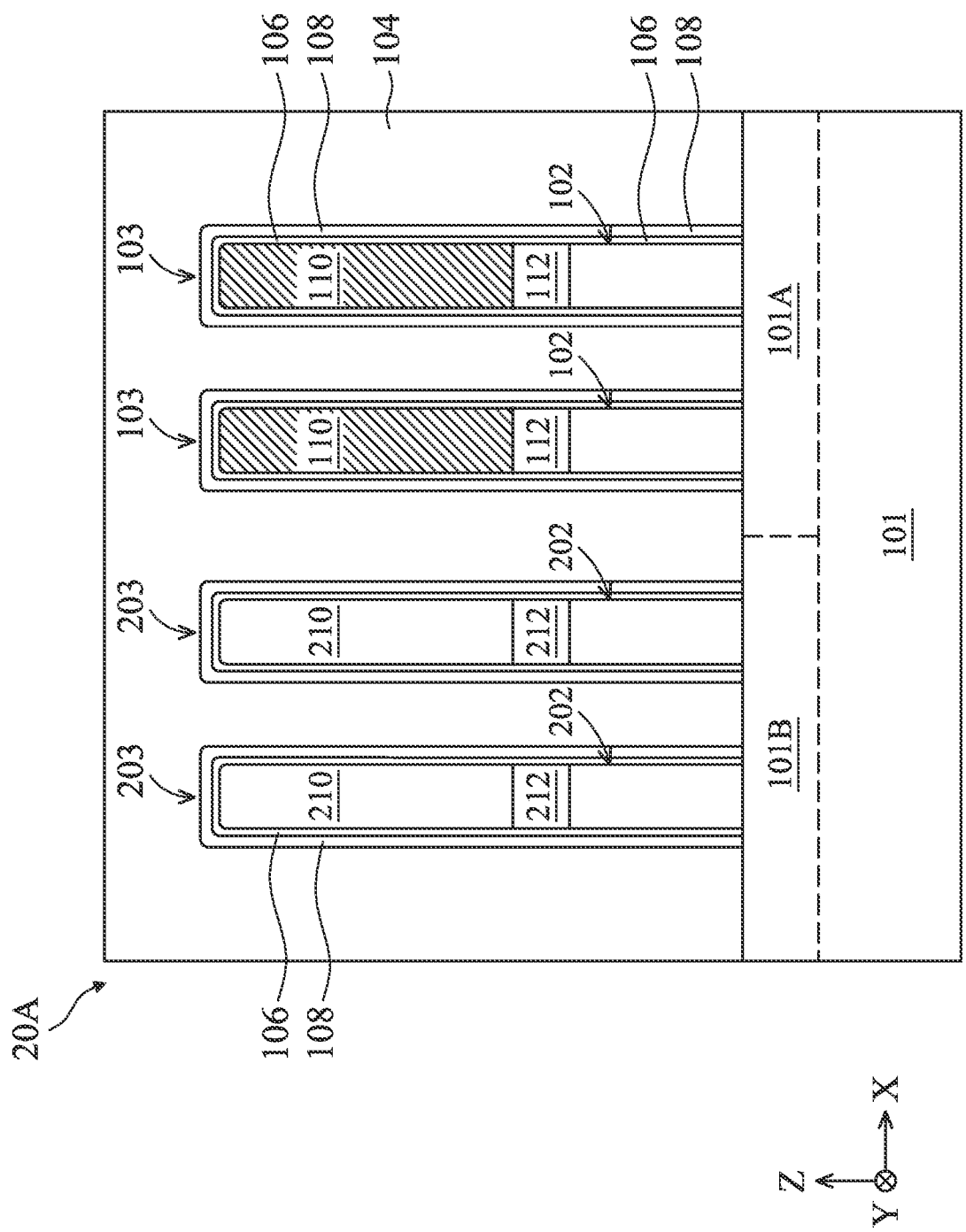
FIGS. 9, 10, 11, 12, 13, 14, 15, 16, 17, and 18 are cross-sectional views of embodiments of the semiconductor device of the present disclosure, at different stages of processing, according to some embodiments of the present disclosure.
Figure 10:
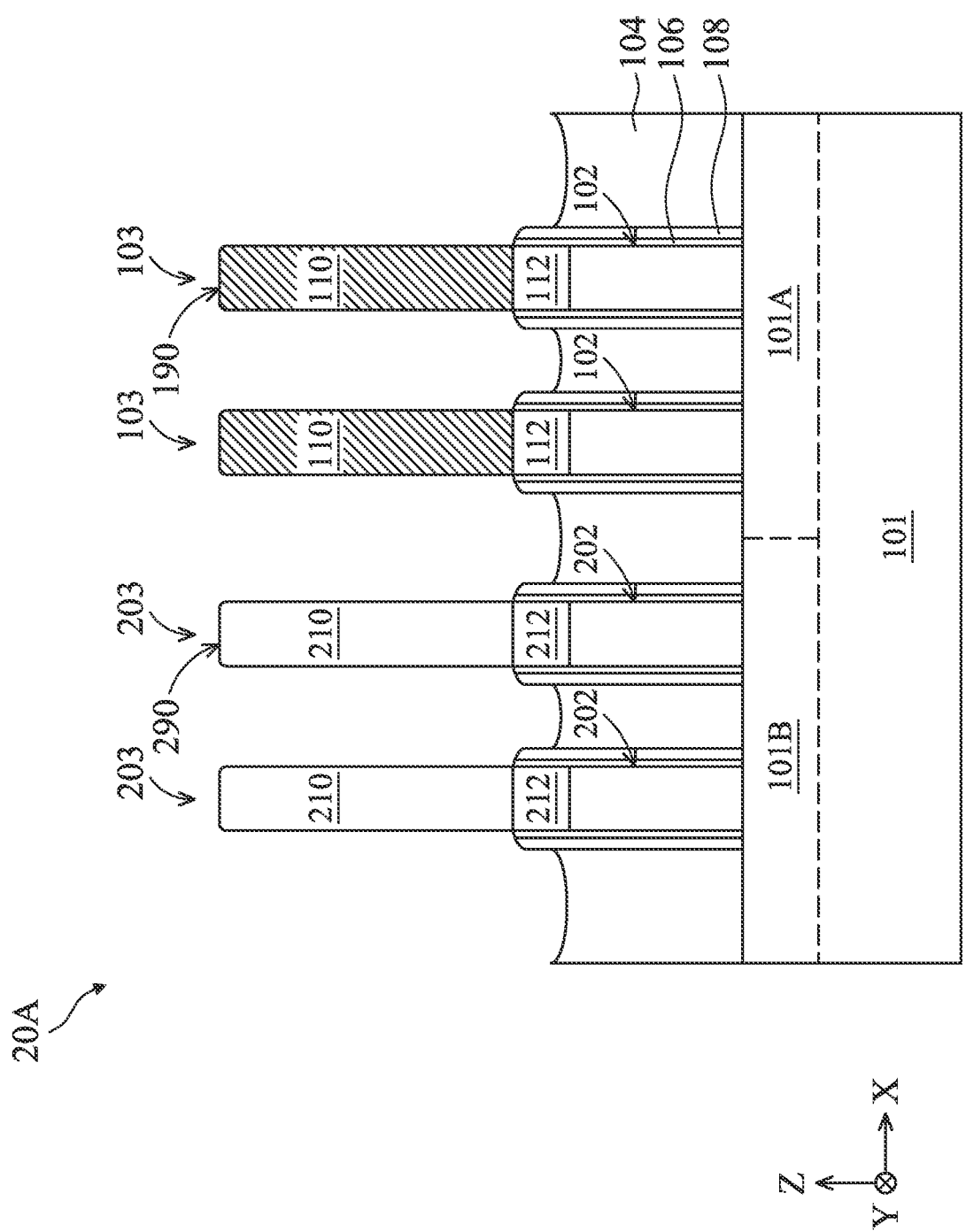
Figure 11:
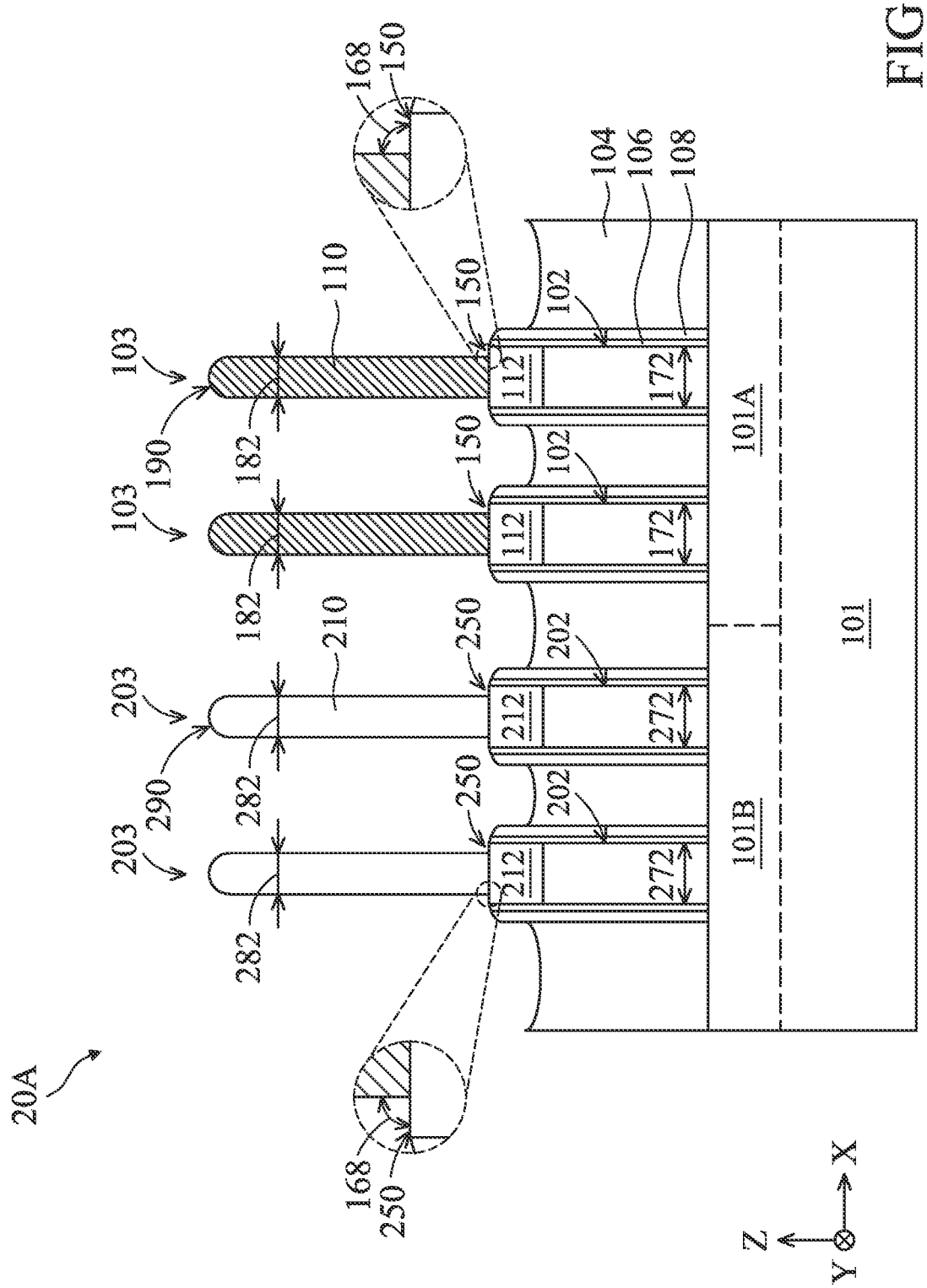

FIGS. 1 and 8A-8B are two flow charts illustrating two example methods, 100A and 100B, respectively, for fabricating semiconductor devices according to embodiments of the present disclosure. FIGS. 2-7 and 9-18 are cross-sectional views of embodiments of the semiconductor devices, at different processing stages of methods 100A and 100B, respectively, according to embodiments of the present disclosure.

Figure 2:
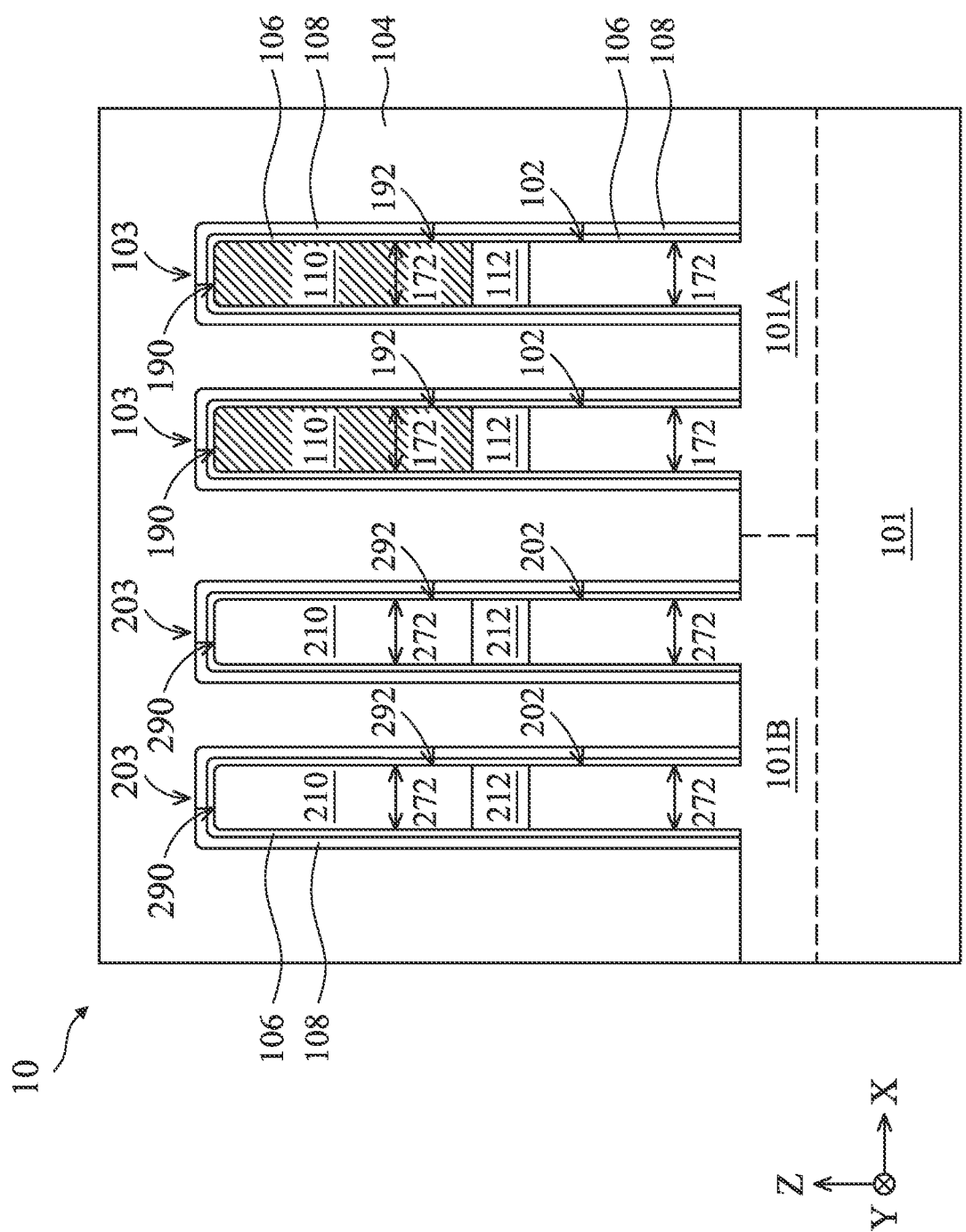
FIGS. 2, 3, 4, 5, 6, 7A, 7B, and 7C are cross-sectional views of embodiments of semiconductor devices of the present disclosure, at different stages of processing, according to some embodiments of the present disclosure.

Referring to block 1010A of FIG. 1 and FIG. 2, an initial semiconductor structure 10 is received. The initial semiconductor structure 10 includes a semiconductor substrate 101. In some embodiments, the semiconductor substrate 101 contains a semiconductor material, such as bulk silicon (Si) or single crystalline Si. Alternatively or additionally, another elementary semiconductor, such as germanium (Ge) in a crystalline structure, may be included in the substrate 101. The semiconductor substrate 101 may also include a compound semiconductor, such as silicon germanium (SiGe), silicon carbide (SiC), gallium arsenic (GaAs), gallium phosphide (GaP), indium phosphide (InP), indium arsenide (InAs), indium antimonide (InSb), or combinations thereof. The semiconductor substrate 101 may also include a semiconductor-on-insulator substrate, such as Si-on-insulator (SOI), SiGe-on-insulator (SGOI), Ge-on-insulator (GOI) substrates. Portions of the semiconductor substrate 101 (e.g., portions 101A and 101B) may be doped. For example, the portion 101A may be doped with n-type dopants, such as phosphorus (P) or arsenic (As); and the portion 101B may be doped with p-type dopants, such as boron (B) or boron fluoride ($BF_3$). In the depicted embodiment, the semiconductor substrate 101 have a top surface that extends along an X-Y plane, defined by the X-direction and the Y-direction.

The initial semiconductor structure 10 further includes fin structures 103 formed in or on the n-type doped regions 101A, and fin structures 203 formed in or on the p-type doped regions 101B. The fin structures 103 and 203 each extend along a Z-direction, that is perpendicular to the X-Y plane. The fin structures (or fins) 103 and 203 may be patterned by any suitable method. For example, they may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins 103 and 203.

The fin structures 103 each has a base portion (or bottom portion) 102 and a channel portion 110. In an embodiment, the base portions 102 and the channel portions 110 include different materials. For example, the base portions 102 include bulk silicon (such as single crystalline silicon, Si) while the channel portions 110 include silicon germanium (SiGe), germanium (Ge), or combinations thereof. The fin structures 203 each also has a base portion 202 and a channel portion 210. In one embodiment, both the base portion 202 and the channel portions 210 include bulk silicon (such as single crystalline silicon). The channel portions 110 and 210 will each engage a gate structure and connect a pair of source/drain features during the operation of subsequently formed transistors. For example, a pair of p-type doped source/drain features will be formed on both sides of the channel portions 110, and a pair of n-type doped source/drain features will be formed on both sides of the channel portions 210.

The base portions 102 each includes an anti-punch through (APT) region 112 immediately below the interface between the base portion 102 and the channel portion 110. Similarly, the base portions 202 each includes an anti-punch through (APT) region 212 immediately below the interface between the base portion 202 and the channel portion 210. As described above, APT regions 112 include n-type dopants at a density higher than the rest of the base portions 102; while APT regions 212 include p-type dopants at a density higher than the rest of the base portions 202. The fin structures 103 and 203 each have a top surface 190 and 290, respectively, and sidewall surfaces 192 and 292, respectively. In some embodiments, the base portions 102 and the channel portions 110 of fin structures 103 each have a lateral width 172 (a dimension along the X-direction between the sidewall surfaces 192); the base portions 202 and the channel portions 210 of fin structures 203 each have a lateral width 272 (between the sidewall surfaces 292). The lateral widths 272 may be the same as or different from the lateral width 172, depending on design requirements. For example, in some embodiments, the lateral widths 272 may be designed to be greater than the lateral widths 172 such that subsequently formed nFETs would have a greater lateral width than subsequently formed pFETs, which may provide a better current balance and/or an increased device speed.

The initial semiconductor structure 10 further includes a liner layer 108 wrapping around the fin structures 103 and 203. For example, the liner layer 108 may be formed conformally (i.e., having substantially the same thickness) on the top and side surfaces of the fin structures 103 and 203. The liner layer 108 may include silicon nitride ($Si_3N_4$). In the depicted embodiments, a second liner layer 106 interposes between the fin structures 103 and the liner layer 108, and between the fin structures 203 and the liner layer 108. Therefore, the initial semiconductor structure 10 includes a combination liner layer structure. The liner layer 106 may be of any suitable liner material. In the depicted embodiment, the liner layer 106 is a silicon dioxide liner layer. In some embodiments (not shown), the liner layer 106 is omitted. The liner layers 106 and 108 may be formed by any suitable technologies. For example, the liner layer 106 and/or 108 may be conformally deposited in a blanket deposition process, such as chemical vapor deposition (CVD), atomic layer deposition (ALD), or similar processes. Alternatively, a silicon dioxide liner layer may be formed by a thermal oxidation process, such as by heating the initial semiconductor structure 10 in a wet environment. The thickness of the liner layer 106 and/or 108 may be selected based on design requirements and may be, for example, between about 1 nm and about 5 nm. If the liner layer thickness is too small, for example, smaller than 1 nm, the liner layer may not reliably fulfill their design functions (such as, as barrier layers, adhesion layers, and/or to protect fin structures from being oxidized). Conversely, if the thickness is too large, for example, greater than 5 nm, the thick liner layer would take away spaces for depositing dielectric layer between adjacent fin structures which may result in voids in the dielectric layer.

The initial semiconductor structure 10 further includes a dielectric layer 104 formed over the semiconductor substrate 101 and surrounding the fin structures 103 and 203. The dielectric layer 104 may be subsequently processed into an isolation feature, for example, a shallow trench isolation (STI) feature. In some embodiments, the formation of the dielectric layer 104 includes filling trenches between fin structures 103 and 203 with one or more dielectric materials, such as silicon dioxide, silicon nitride, silicon oxynitride, other suitable materials, or combinations thereof. Any appropriate methods, such as a CVD process, an ALD process, a PVD process, a plasma-enhanced CVD (PECVD) process, a plasma-enhanced ALD (PEALD) process, or combinations thereof, may be used for depositing the dielectric layer 104. Alternatively, the dielectric layer 104 may be formed using any other traditional isolation technologies. In the depicted embodiment, the dielectric layer 104 includes primarily silicon dioxide ($SiO_2$).

Figure 3:
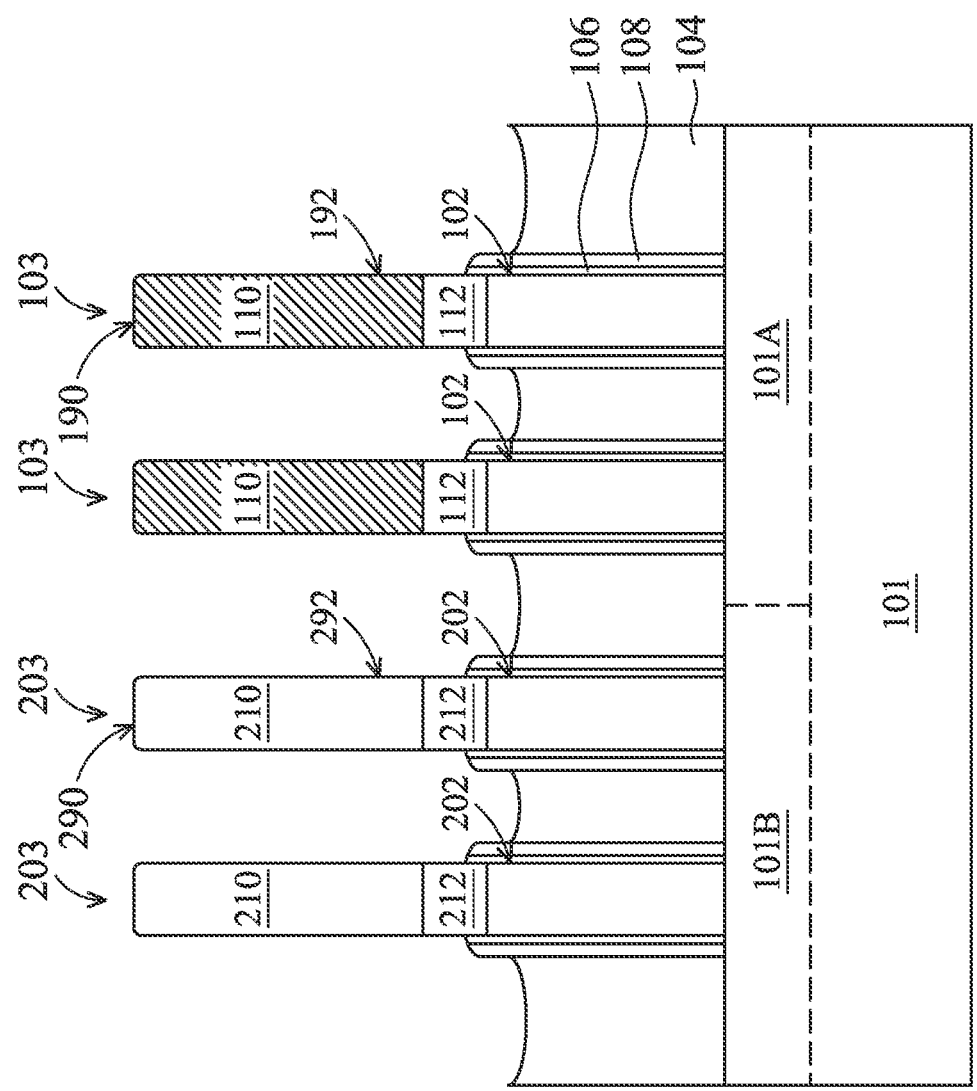

Referring to block 1020A of FIG. 1 and FIG. 3, the dielectric layer 104 and the liner layers 106 and 108 are recessed to form a recessed dielectric layer 104, recessed liner layer 106 and recessed liner layer 108, respectively. The recess process may implement any suitable recessing technologies, such as a wet etching technology, a dry etching technology, or combinations thereof. Meanwhile, the recess process causes portions of the fin structures 103 and 203 to be exposed. Accordingly, top surfaces 190 and 290 of the fin structures 103 and 203 are exposed, along with sidewall surfaces 192 and 292 of the fin structures 103 and 203. Specifically, the channel portions 110 and at least a top section of the APT regions 112 are exposed over the n-type doped region 101A; and the channel portions 210 and at least a top section of the APT regions 212 are exposed over the p-type doped region 101B. Accordingly, the top surfaces of the liner layers 106 and 108 extend between the top surface and the bottom surface of the APT region 112 over the n-type doped region 101A and extend between the top surface and the bottom surface of the APT region 212 over the p-type doped region 101B. However, as described later, the top surface of the liner layers 106 and 108 may extend along a level below the bottom surface of the APT regions 112 and 212 in some embodiments. As described in detail later, the at least partially exposed APT regions 112 are affected by the fixed charges on the liner layer 108 to a lesser extent than if otherwise entirely covered by the liner layer 108. This contributes to an improved (i.e. smaller) OFF-state leakage current.

Figure 4:
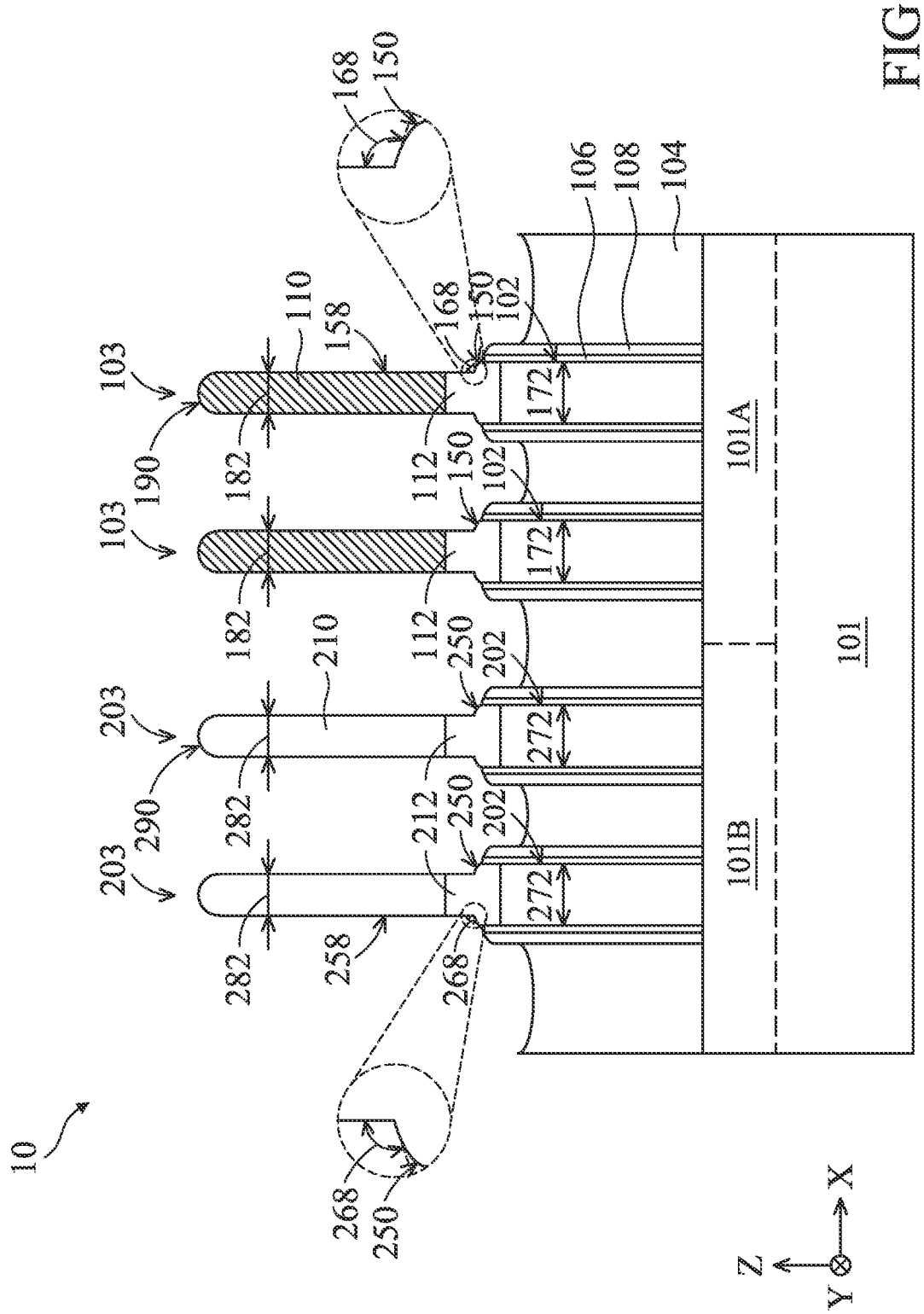

Referring to block 1030A of FIG. 1 and FIG. 4, the exposed portions of the fin structures 103 and 203 are trimmed (or thinned) laterally, such that they each have a reduced lateral width. In some embodiments, the trimming process is implemented to control the dimensions of the fin structures 103 and 203, so as to reach the desired critical dimension (CD), while maintaining relatively wide lower portions to ensure the stability of the fin structures. The trimming process may implement any suitable trimming technology. As a result of this trimming process, the channel portions 110 of the fin structures 103 each has a new sidewall surface 158, and the channel portions 210 of the fin structures 203 each has a new sidewall surface 258. The channel portions 110 has a lateral width 182 between opposing sidewall surfaces 158, that is smaller than the corresponding lateral widths 172. Similarly, the channel portions 210 each has a lateral width 282 between the opposing sidewall surfaces 258, that is smaller than the corresponding lateral widths 272. The channel portions 110 and 210 later serve as the channel regions of subsequently formed transistors. Accordingly, the lateral widths 182 and 282 are interchangeably referred to as channel widths 182 and 282, respectively. In some embodiments, the lateral widths 182 may be the same as or different from the lateral width 282, depending on design requirements. For example, in some embodiments, the lateral widths 282 may be designed to be greater than the lateral widths 182 for increased device speed.

As illustrated in FIG. 4, the trimmed fin structures 103 and 203 include a shoulder surface 150 and 250, respectively. These shoulder surfaces each span an angle from an adjacent vertical sidewall of the fin structure. For example, the shoulder surface 150 spans an angle 168 from the sidewall surface 158 of the fin structure 103, and the shoulder surface 250 spans an angle 268 from the sidewall surface 258 of the fin structure 203. In some embodiments, each of the angles 168 and 268 is about 90° to about 180°. If the angle 168 or 268 is too small, such as less than 90°, subsequent deposition of capping layers may not reliably cover the entire surface of the trimmed fin structures 103 and 203. As a result, voids may form and lead to device performance degradation. In some embodiments, the trimming process also alters the profile of the top surfaces 190 and 290 of the fin structures 103 and 203, respectively, such that they each have profiles that are more rounded than they were before the trimming process.

In the depicted embodiments, the APT regions 112 and 212 are partially trimmed during the trimming process.

Accordingly, the top section of the APT region 112 (such as the section above the level where the top surface of the liner layer 108 extends) has a lateral width consistent with the channel portion 110, that is, about the same as lateral width 182; while a bottom section of the APT region 112 (such as the section below the level where the top surface of the liner layer 108 extends) has a lateral width consistent with the base portion 102, that is, about the same as lateral width 172. Similarly, a top section of the APT region 212 has a lateral width consistent with the channel portion 210, that is, about the same as lateral width 282; while a bottom section of the APT region 212 has a lateral width consistent with the base portion 202, that is, about the same as lateral width 272. In other words, the APT regions 112 and 212 each has a wider lower section and a narrower top section; and the sidewalls of the APT sections 112 and 212 each has an exposed stepped profile including the shoulder surfaces 150 and 250, respectively.

Figure 5:
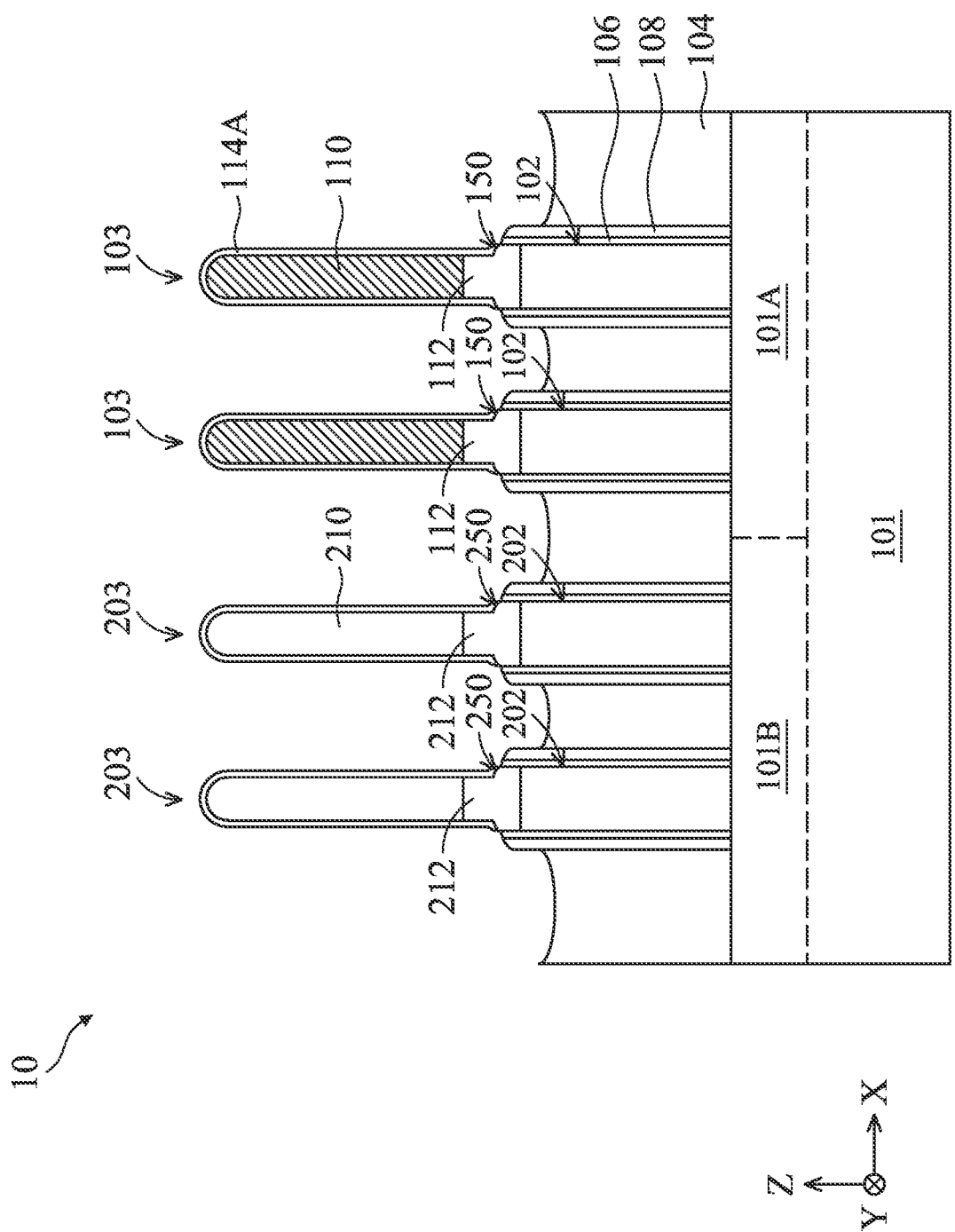

Referring to block 1040A of FIG. 1 and FIG. 5, a capping layer 114A is formed conformally over the exposed surfaces of the trimmed fin structures 103 and 203. In other words, over the n-type doped region 101A, the capping layer 114A wraps around the exposed top and side surfaces of channel portion 110 and the exposed side surfaces of base portion 102. The shoulder surfaces 150 of the APT regions 112 directly interface with the capping layer 114A. Over the p-type doped region 101B, the capping layer 114A wraps around the exposed top and side surfaces of channel portion 210 and the exposed side surfaces of the base portion 202. The shoulder surfaces 250 of the APT regions 212 directly interface with the capping layer 114A. In the depicted embodiments, the capping layer 114A is a layer including silicon such as crystalline silicon, poly silicon or amorphous silicon. However, the capping layer 114A may be of any suitable capping layer material. In some embodiments, the capping layer 114A protects the channel portions 110, for example, of a SiGe material, from oxidation during subsequent treatments.

Figure 6:
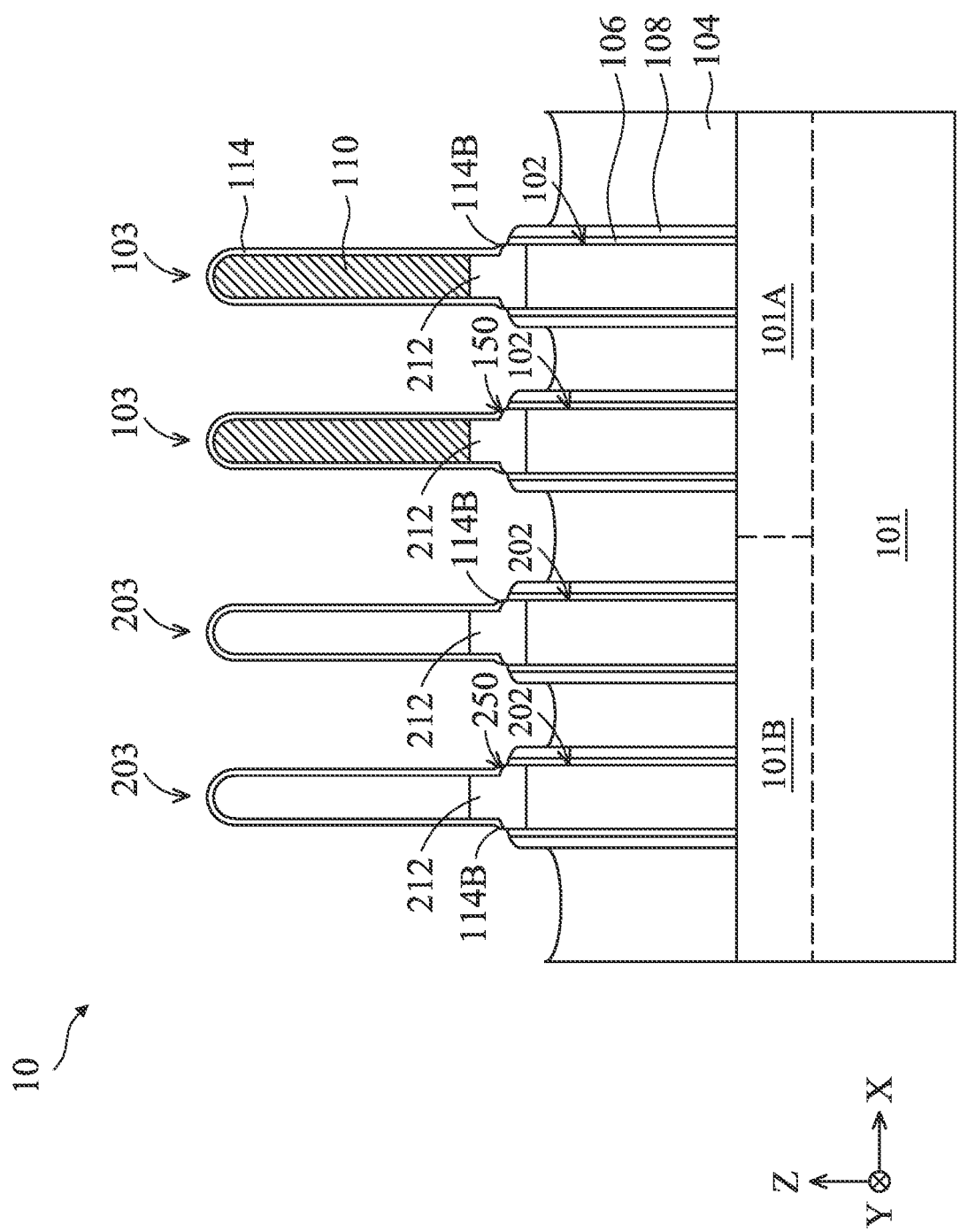

Referring to block 1050A of FIG. 1 and FIG. 6, an annealing process is conducted to transform the capping layer 114A into the capping layer 114. In the depicted embodiment, the annealing process converts the silicon-containing capping layer 114A into an oxide capping layer 114 (e.g., having silicon dioxide ($SiO_2$)), without substantially changing the profile of the capping layer. Accordingly, physical features described above with respect to capping layer 114A also apply to the capping layer 114. As illustrated in FIG. 6, a lower section of the capping layer 114 (referred to as 114B) is formed over and directly interface with the shoulder surfaces 150 and 250, respectively. In some embodiments, the oxide capping layer 114 prevents or eliminates diffusion and/or reaction of constituents of the channel portions 110 and/or 210 with subsequently formed gate components (as described later). In some embodiments, the capping layer 114 serves as an interfacial layer to improve the adhesion between the fin structures and a subsequently formed gate dielectric layer. In some embodiments, the presence of the interfacial layer does not substantially impair (and sometimes improves) electronic contacts between the two materials on its two sides. The annealing process may implement any suitable parameters. In some embodiments, the annealing process is conducted at a temperature of about 700° C. to about 1500° C.

Referring to block 1060A of FIG. 1 and FIG. 7A-7C, gate structures 140 are formed to engage with the channel portion 110 of the fin structures 103 and the channel portion 210 of the fin structures 203. In the depicted embodiment, gate structure 140 extends over and across fin structures 103 and 203. The gate structure 140 includes a gate dielectric 116, formed conformally over and interfacing with the capping layer 114 including the section 114B (see FIG. 6). In some embodiments, the gate dielectric layer 116 is a high-k gate dielectric layer. A high-k dielectric layer contains a dielectric material having a dielectric constant greater than a dielectric constant of $SiO_2$, which is approximately 3.9. For example, the gate dielectric 116 may include hafnium oxide ($HfO_2$), which has a dielectric constant in a range from about 18 to about 40. As various other examples, the gate dielectric layer 116 may include $ZrO_2$, $Y_2O_3$, $La_2O_5$, $Gd_2O_5$, $TiO_2$, $Ta_2O_5$, HfErO, HfLaO, HfYO, HfGdO, HfAlO, HfZrO, HfTiO, HfTaO, SrTiO, or combinations thereof. The formation of the gate dielectric 116 may be by any suitable processes, such as CVD, PVD, ALD, or combinations thereof.

The gate structure 140 further includes a gate electrode layer 118 formed over the gate dielectric 116. The gate electrode layer 118 may include any suitable materials, such as titanium nitride (TiN), tantalum nitride (TaN), titanium aluminide (TiAl), titanium aluminum nitride (TiAlN), tantalum aluminide (TaAl), tantalum aluminum nitride (TaAlN), tantalum aluminum carbide (TaAlC), tantalum carbonitride (TaCN), aluminum (Al), tungsten (W), copper (Cu), cobalt (Co), nickel (Ni), platinum (Pt), or combinations thereof.

As described above, the liner layer 108 may include silicon nitride, and may accrue positive fixed charges on its top surface. Those fixed charges may trap electrons during an operation cycle (for example, due to direct contact between the gate structure and the liner layer). Those additional electrons assert electrostatic interactions on, for example, the n-type dopants of the APT regions 112. However, this electrostatic interaction may be of different magnitudes on different portions of the APT regions 112. For example, the top sections of the APT regions 112 are remote from the fixed charges, and the bottom sections of the APT regions 112 are adjacent to the fixed charges. Because the electrostatic interactions inversely scale with the square of the distance between the two interacting charged species, the effect of the fixed charges on the dopants in the top sections of the APT regions 112 is substantially less than that on the dopants in the bottom section of the APT regions 112. Moreover, this effect is also substantially less than that in a configuration where the entire side surfaces of the top section is covered by the liner layer 108. As described above, the electrostatic interaction causes reductions in the effectiveness of the APT regions 112. Therefore, by configuring the top sections of the APT regions 112 to be spaced away from the liner layer 108, the effectiveness of the APT regions 112 is improved and the OFF-state current leakage are minimized.

As illustrated in FIG. 7A, a distance between the top surface of the liner layer 108 and a bottom surface of the channel portions 110 and 210, along a direction orthogonal to the surface of the substrate 101, is distance 120. In some embodiments, the distance 120 is less than about 30 nm. If the distance 120 is too large, for example, larger than about 30 nm, there may be narrow spaces between bottom portions of the adjacent fins, and it may be challenging to avoid short circuit formation therebetween. In some embodiments, the distance 120 is greater than about 20 nm. Accordingly, a majority of the APT regions 112 and 212 are remote from the fixed charges. As a result, the effect of electrostatic attraction is minimized. In an embodiment, the thickness of APT region 112 and 212 is distance 122; and the distance between a top surface of liner layer 108 and a bottom surface of the APT region 112 and 212 is the distance 124. As illustrated in FIG. 7A, the distance 122 is greater than the distance 120, and equals to the sum of the distance 120 and the distance 124. In this example, the bottom surfaces of APT region 112 and 212 extend over a top surface of the dielectric feature 104.

FIG. 7B illustrates an alternative embodiment. For example, the distance 122 may be smaller than distance 120. Accordingly, a gap having a height 124 exists between the top surface of the liner layer 108 and the bottom surface of the APT region 112. In other words, fixed charges accumulated at the top surface of the liner layer 108 are remote from the entirety of the APT regions 112. Accordingly, the electrostatic interaction asserted by the fixed charges is further reduced as compared to the embodiment illustrated in FIG. 7A.

While FIGS. 7A and 7B show the lower surface of the APT regions 112 and 212 extending above the top surface of the dielectric layer 104, this is not always necessary. For example, FIG. 7C illustrates an embodiment that generally resembles that of FIG. 7A. However, the bottom surface of the APT regions 112 and 212 extend below a top surface of the dielectric layer 104. This embodiment therefore provides APT regions that are larger in size than those illustrated in FIGS. 7A and 7B. In some embodiments, this embodiment is advantageous because larger APT regions can accommodate a larger amount of initial dopants.

It has been found that devices formed according to the embodiments described above have an OFF-state leakage current substantially reduced as compared to other methods (such as where silicon nitride liner layers cover the entirety of the side surfaces of the APT regions 112). In an embodiment, the semiconductor structure 10 is configured according to FIG. 7A, and the distance 120 is about 5 nm. In other words, the top section of the APT region 112, having a height of about 5 nm, is adjacent to the gate electrode 140 (through the capping layer 114). During a stress test, a negative bias of −2.3V is applied to the device for 1,000 seconds. The OFF-state current $I_{OFF}$ after hot carrier injection is measured to be less than 100 times of the OFF-state current $I_{OFF}$ before the hot carrier injection. By contrast, a device having the liner layer 108 covering the entire side surfaces of the APT region 112 exhibit, under the same stress testing condition, an increase in the OFF-state current $I_{OFF}$ after hot carrier injection almost 10,000 times of the OFF-state current $I_{OFF}$. In other words, by leaving a section of the APT region exposed to the gate structure (through the capping layer 140), the OFF-state current leakage is substantially mitigated (such as by a factor of several hundreds).

The embodiments described above alleviate the charge trapping by exposing a top section of the APT region 112 to a gate structure 140 (through the capping layer 114, i.e. without interposing liner layer 108), and/or by leaving a gap between the APT region 112 and the top surfaces of the liner layer 108. FIGS. 8A-8B and FIGS. 9-17 illustrate an alternative embodiment, method 100B, for fabricating a similar semiconductor structure 20A. In semiconductor structure 20A, the liner layer 108 is isolated from gate structures by dielectric materials. Therefore, during operating cycle stress, electrons are not trapped on surfaces of the liner layer 108 by positive fix charges, and the APT region 112 dosage is no longer affected, regardless of the relative position of the liner layer 108.

Referring to blocks 1010B to 1030B of FIG. 8A and FIGS. 9-11, an initial semiconductor structure 20A is processed to form fin structures 103 and 203 in or on the n-type doped regions 101A and the p-type doped regions 101B, respectively. This portion of the method 100B is generally similar to the method 100A already described above with respect to FIGS. 1-7. For example, the device structure of FIG. 9 resembles that described in FIG. 2; and the device structure of FIG. 10 resembles that described in FIG. 3. Moreover, the device structure illustrated in FIG. 11 generally resembles that described in FIG. 4. For example, the fin structures 103 and 203 each includes a base portion 102 and 202, and a channel portion 110 and 210, respectively. Furthermore, the base portions 102 of fin structures 103 and the base portions 202 of fin structures 203 each has a lateral dimension 172 and 272, respectively; and the channel portions 110 of fin structures 103 and the channel portions 210 of fin structures 203 each has a lateral dimension 182 and 282, respectively. As described earlier, dimension 182 is smaller than dimension 172; and dimension 282 is smaller than dimension 272. Fin structures 103 and 203 each also includes APT regions 112 and 212, respectively. In the depicted embodiment, FIG. 11 differs from FIG. 4 in that the recessed liner layers 106 and 108 extend vertically to the bottom surface of the channel portions 110 and 210, which is also the top surface of the APT regions 112 and 212. In other words, no portions of the APT regions 112 and 212 are recessed. Accordingly, the APT regions 112 and 212 have a smooth sidewall profile, as opposed to the stepped profile illustrated in FIG. 4. Moreover, a portion of the top surfaces of the APT regions 112 and 212 (such as the shoulder surfaces 150 and 250) are not covered by the top portions 110 and 210, respectively. In the depicted embodiments, the angles 168 and 268 are each about 90°. However, other configurations are possible, as described later. For example, the angles 168 and 268 may be greater than about 90° and less than about 180°.

Figure 12:
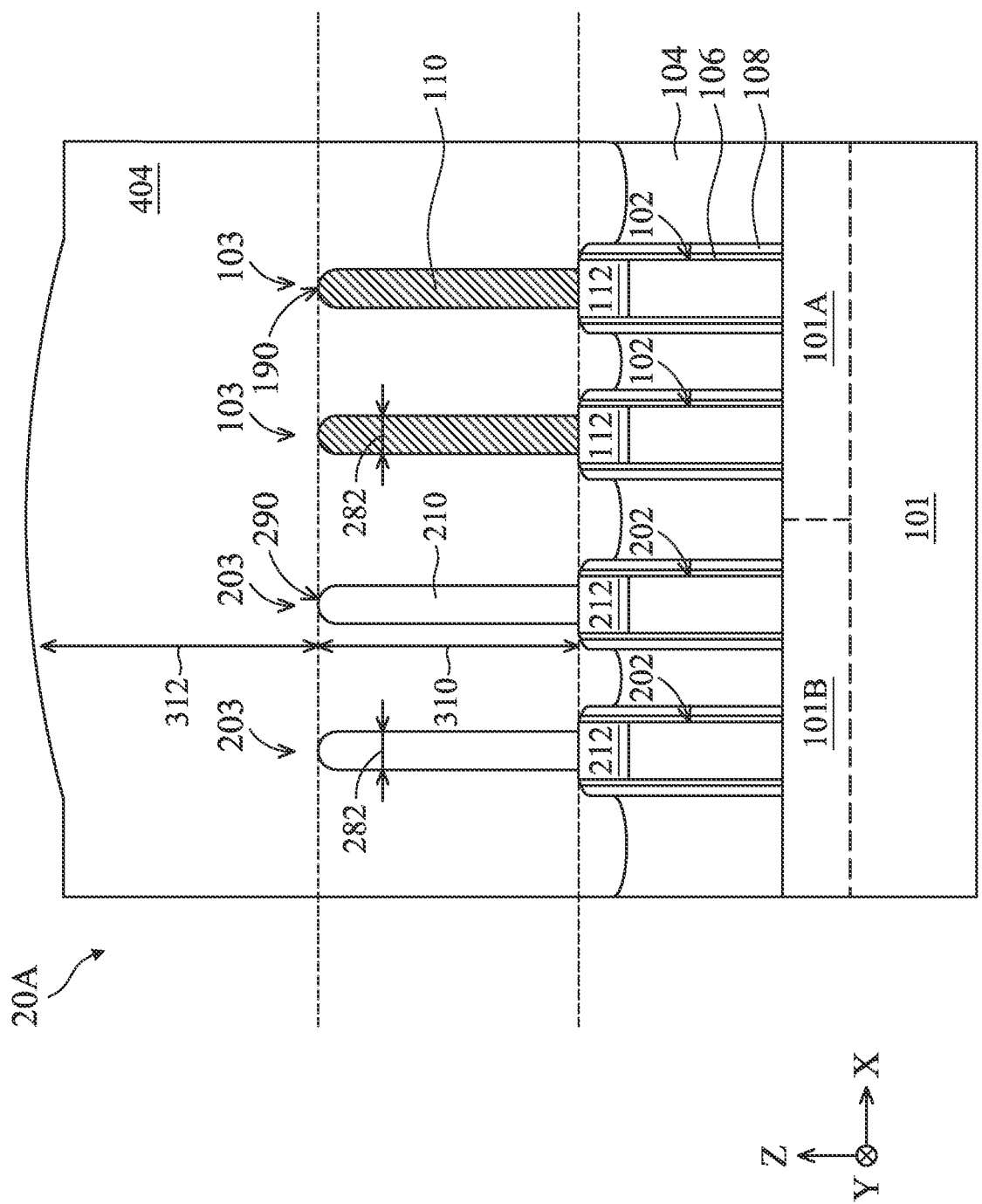

Referring to block 1040B of FIG. 8A and FIG. 12, a dielectric layer 404 is deposited over the dielectric layer 104, and over the trimmed fin structures 103 and 203. The dielectric layer 404 covers the entirety of the fin structures 103 and 203. Accordingly, the top surface of the dielectric layer 404 extends over a top surface of the fin structures 103 and 203. The combination of the dielectric layer 404 and dielectric layer 104 forms an isolation feature. In the depicted embodiment in FIG. 12, the fin structures 103 and 203 each has a channel height of 310; and the dielectric layer 404 extends above a top surface of the fin structures 103 and 203 by a height 312. In some embodiments, a ratio of height 312 to the channel height 310 is greater than about 0.4 to about 0.6. If the ratio is too low, for example, below about 0.4 to about 0.6, a subsequent planarization process may affect the integrity of the fin structures 103 and 203.

Figure 13:
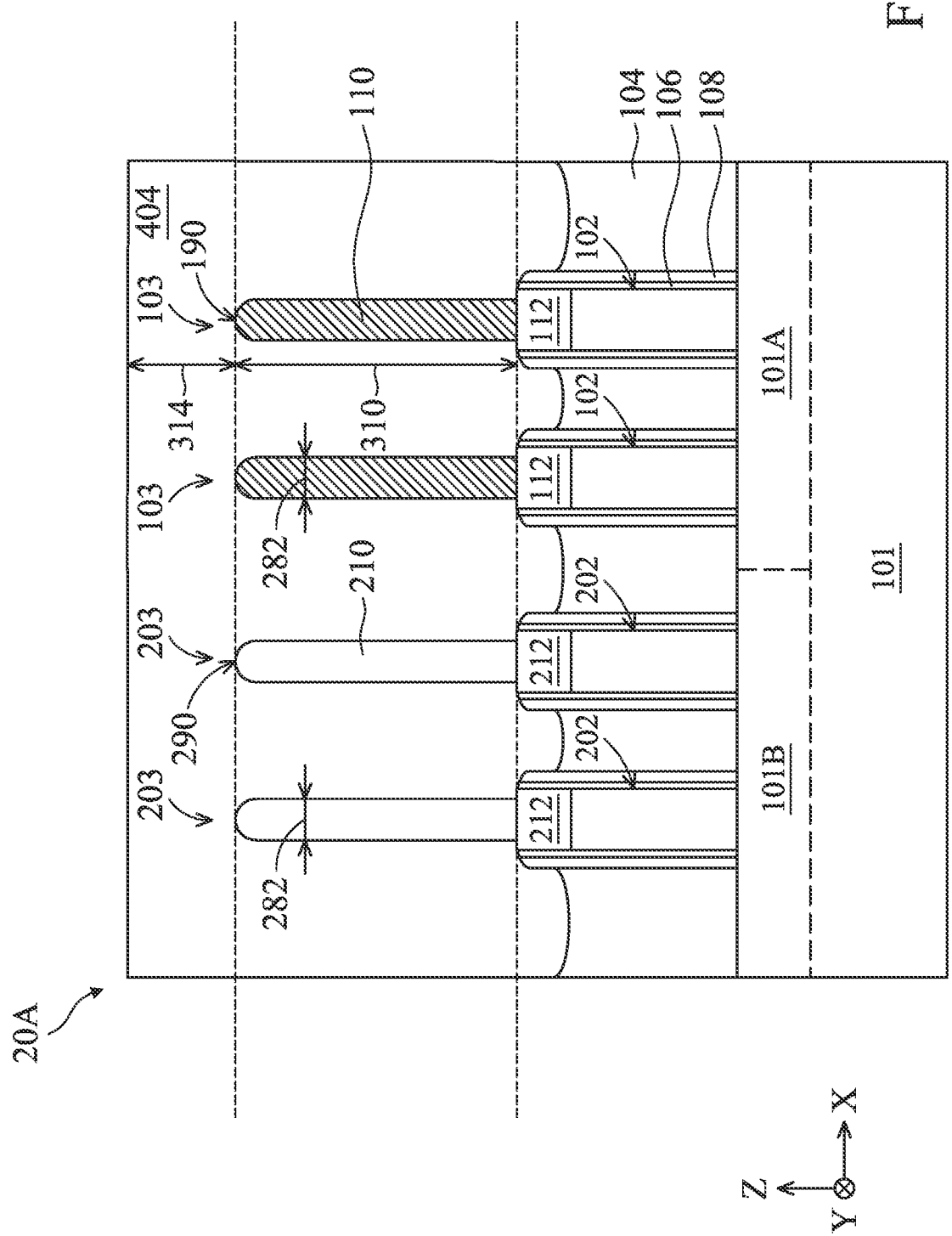

Referring to block 1050B of FIG. 8A and FIG. 13, a chemical mechanical polishing (CMP) process is conducted on the dielectric layer 404. This process planarizes the top surface of the dielectric 404 for subsequent processing. The planarized dielectric layer 404 extends over the top surface of the fin structures 103 and 203 by a height 314. Accordingly, the entirety of fin structures 103 and 203 are buried under the top surface of the dielectric layer 404.

Figure 14:
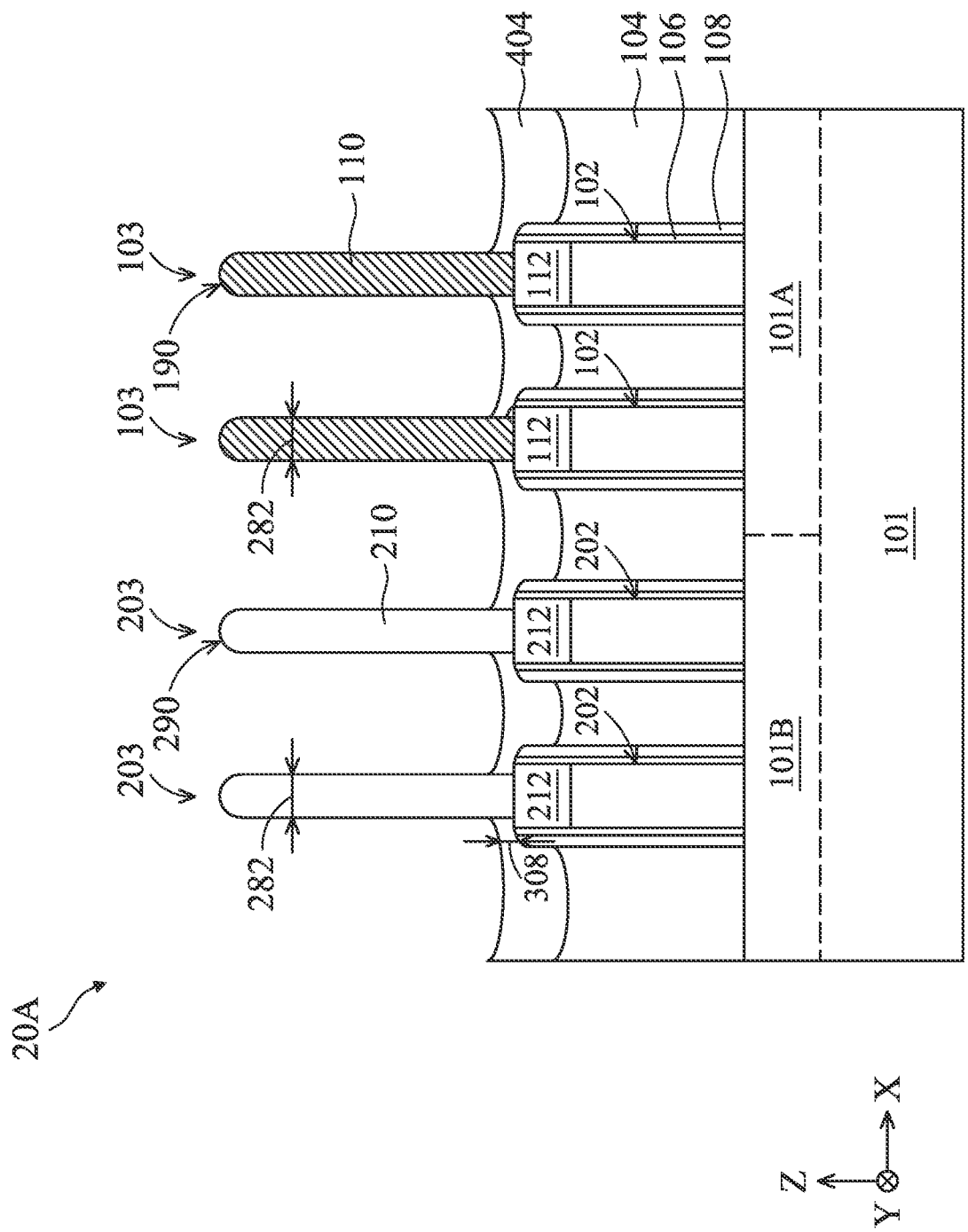

Referring to block 1060B of FIG. 8B and FIG. 14, the dielectric layer 404 is recessed to expose a portion of the trimmed fin structures 103 and 203. However, the recessing process does not remove the entirety of the dielectric layer 404. Rather, the recessing process leaves a portion of the dielectric layer 404 such that the liner layer 108 is embedded, in their entireties, under the dielectric layer 404. For example, the shoulder surfaces 150 and 250 remain covered by the dielectric layer 404. As described above, the liner layer 108 extends below the shoulder surfaces 150 and 250.

Therefore, the liner layer 108 is isolated from any subsequently formed layers (including the gate structure 140). This configuration is advantageous, because subsequently formed gate structure is separated away from the liner layer 108. Accordingly, any bias applied to the gate structure will no longer cause substantial electron accumulations at the surfaces of the liner layer 108 (for example, due to the absence of substantial accumulation of positive charges), regardless of the liner layer's material. As a result, no electrostatic interactions exist that would reduce the effective dosages of the APT regions 112. The OFF-state leakage current is therefore minimized. In some embodiments, the dielectric layer 404 has a top surface that extends above a top surface of the liner layer 108 by a distance 308. The distance 308 is about 1 nm to about 3 nm. If the distance 308 is too small, for example, smaller than 1 nm, the thin dielectric layer 404 may not function as an effective barrier and may fail to prevent electrons being trapped at the top surface of the liner layer 108. If the distance 308 is too large, a large portion of the channel is not effectively controlled by the subsequently formed gate structure 140.

Figure 15:
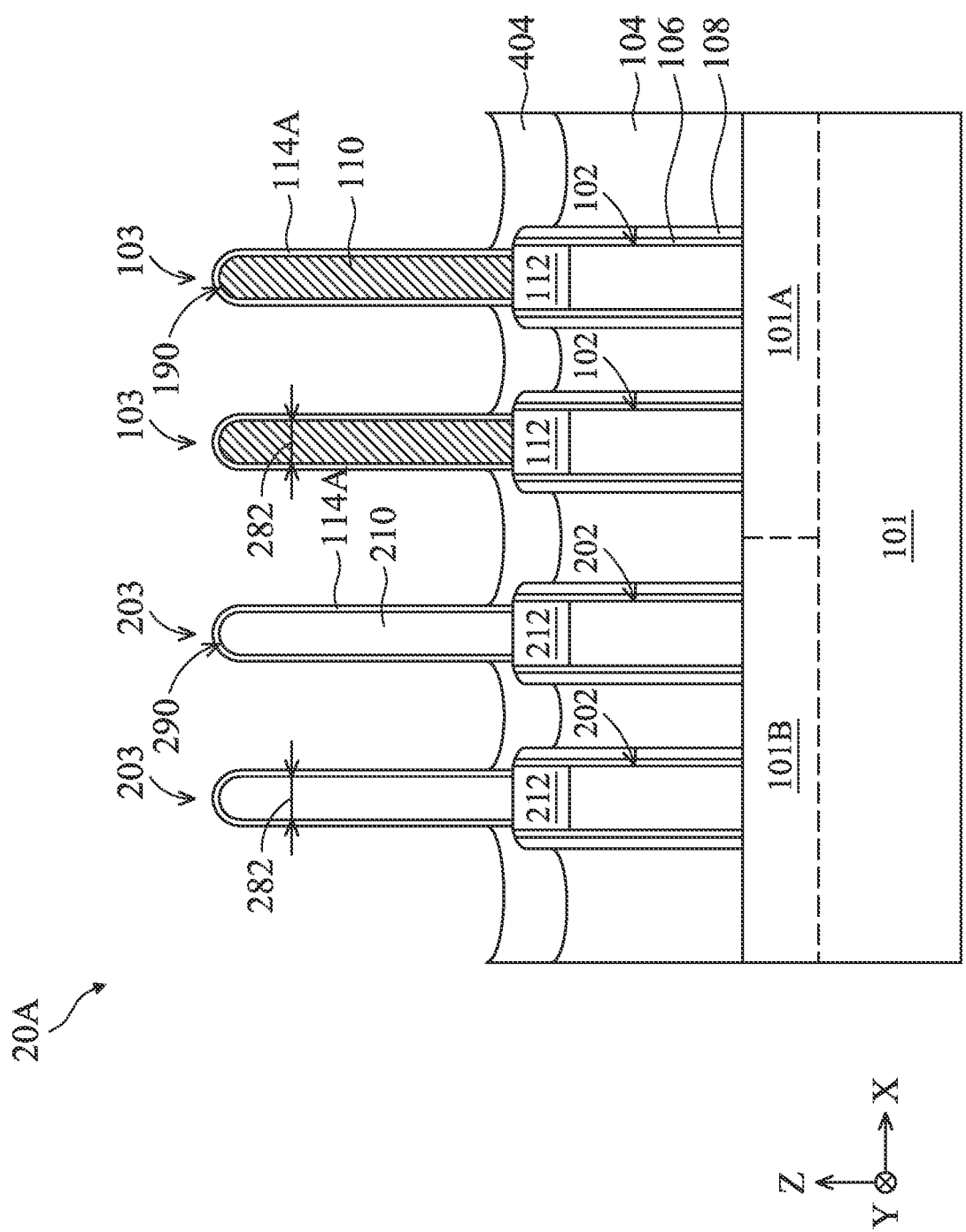
Figure 16:
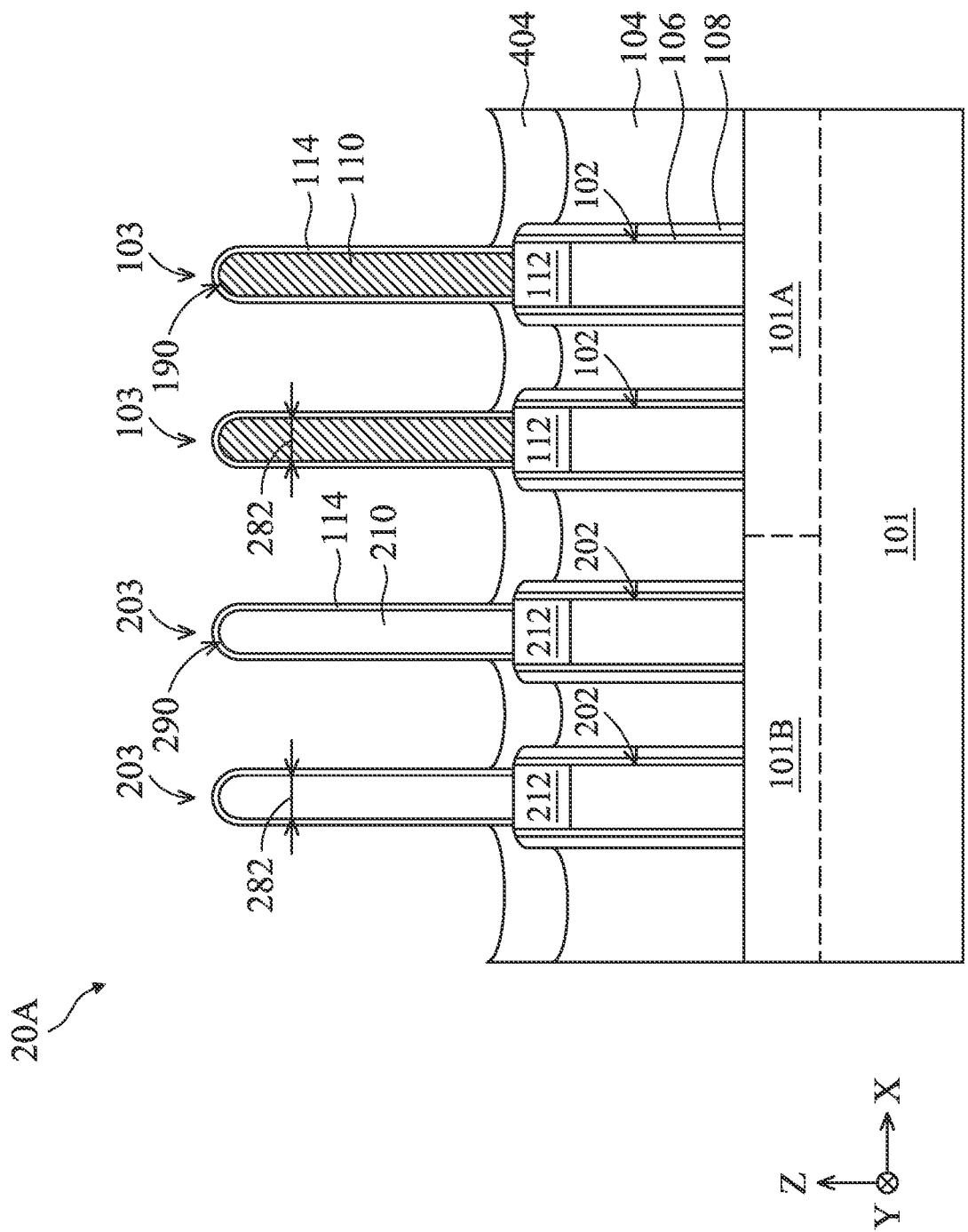
Figure 17:
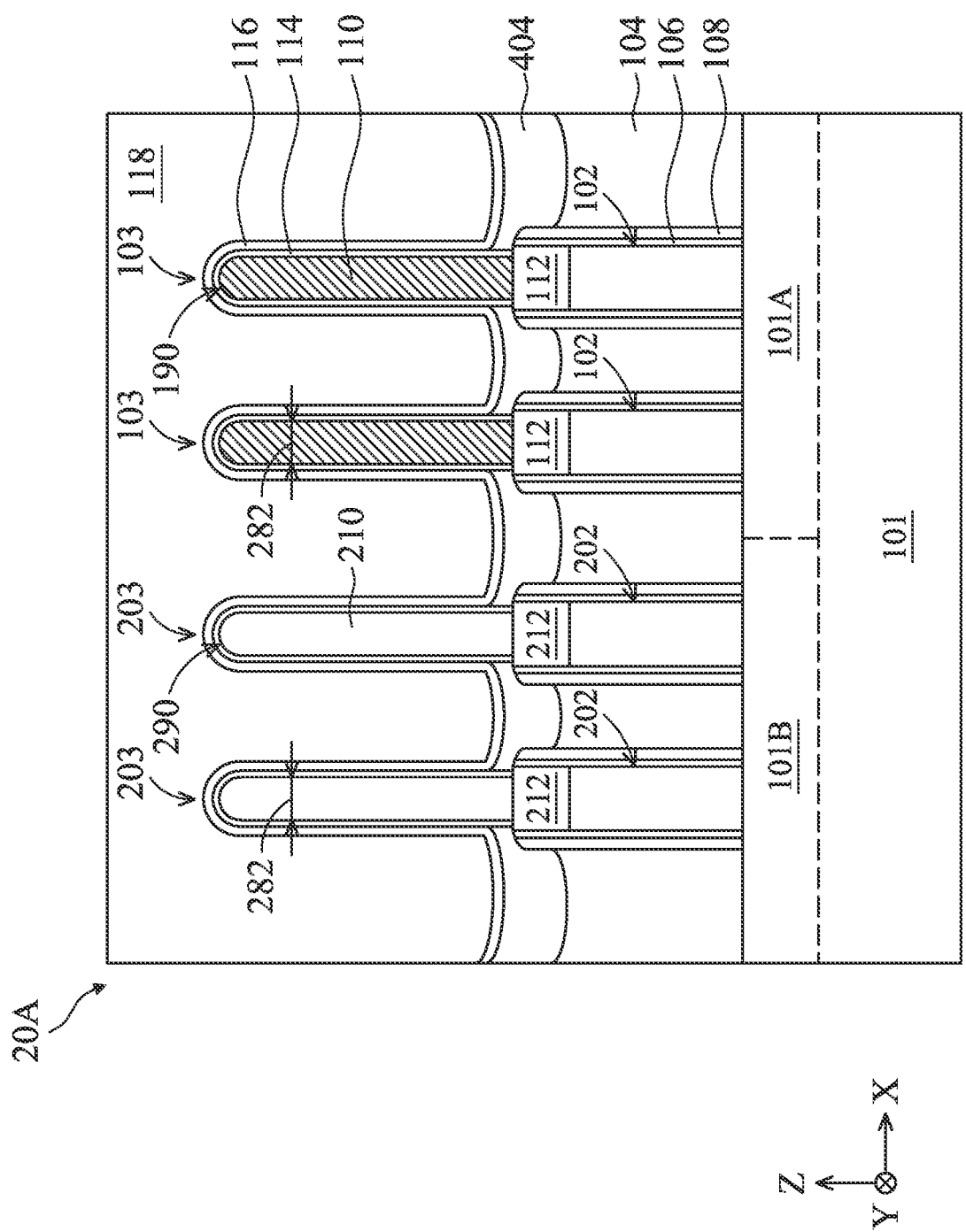

Referring to blocks 1070B-1080B of FIG. 8B and FIGS. 15-16, a capping layer 114A is formed over the exposed trimmed fin structures 103 and 203, and subsequently annealed to form a capping layer 114. This is similar to the block 1040A and 1050A in FIG. 1. Referring to block 1090B of the FIG. 8B and FIG. 17, a gate structure 140 is formed over the dielectric layer 404 and over the capping layer 114. This is similar to the block 1060A of FIG. 1. The device structure of FIG. 17 generally resembles the device structure of FIGS. 7A, 7B, and/or 7C. FIG. 17 differs from FIGS. 7A, 7B, and/or 7C in that a top surface of the dielectric layer 404 extends over a top surface of liner layer 108.

Figure 18:
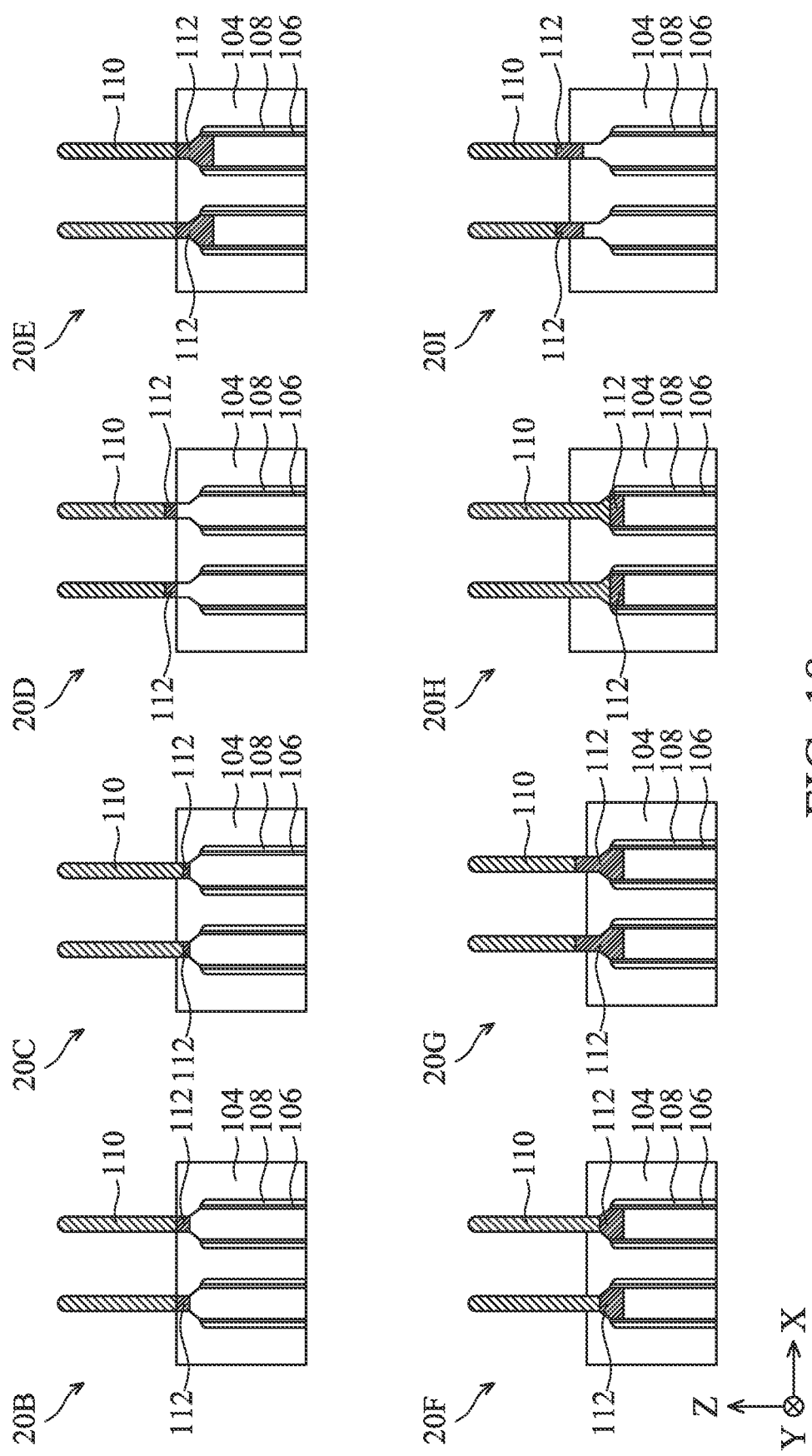

While FIG. 17 depicts the APT regions 112 and 212 each having a top surface extending along a top surface of the liner layer 108, other configurations are possible. FIG. 18 illustrates several (and not inclusively) alternative embodiments of the semiconductor structure, 20B-20G. FIG. 18 only depicts the portion of semiconductor device 10 in the n-type doped regions 101A for clarity and simplicity. As illustrated in FIG. 18, the position and the size of the APT regions vary from what is depicted in FIG. 17. For example, the APT regions 112 may have a top surface extending above, along, or below the top surface of the dielectric layer 404. The APT regions 112 may also have a bottom surface that extends above, along, or below the top surface of the dielectric layer 404.

The methods described herein may be applied not only to the present technology nodes, but also to newer technology nodes that may be later developed. For technology nodes of a critical dimension less than 5 nm, liner thickness may need to be optimized. For example, the liner layer 108 may have a thickness of about 1 nm to about 5 nm. If the thickness is too large, for example, greater than 5 nm, the dielectric layer 404 described above with respect to FIGS. 8A and 8B may not reliably fill openings between the fin structures. If the thickness is too small, for example less than 1 nm, the liner layer 106 and/or liner layer 108 may not be sufficient to fulfill their design functions (such as, as barrier layers, adhesion layers, and/or to protect fin structures from being oxidized).

Though not intended to be limiting, embodiments of the present disclosure offer benefits for semiconductor processing and semiconductor devices. For example, the disclosed methods mitigate or eliminate the effect of fixed charges at silicon nitride liner layer on the APT regions. For a specific example, the silicon nitride liner layer is formed to only partially cover the sidewall surfaces of the APT region. Therefore, a portion of the APT region is remote from the fixed charges, and is exposed to the gate structure through a capping layer. For another specific example, the silicon nitride liner layer is isolated from gate structures by dielectric materials. Therefore, electrons are not trapped on the surfaces of the liner layer. Accordingly, the APT region is no longer affected. Accordingly, integrity and effectiveness of the APT region are preserved, and bottom leakage in the OFF-state is minimized. This contributes to overall improvement of device power efficiency. As such, the present disclosure provides methods that improve the performance, functionality, and/or reliability of semiconductor devices.

In an exemplary aspect, the present disclosure is directed to a device. The device includes a semiconductor substrate and a fin structure over the semiconductor substrate. The fin structure includes a bottom portion with a first material and a top portion with a second material. The second material is different from the first material. The device also includes a liner layer on a sidewall of the bottom portion. A top surface of the liner layer extends below a bottom surface of the top portion. The device further includes a dielectric layer over the semiconductor substrate and on side surfaces of the liner layer, and an interfacial layer. The interfacial layer has a first section on and directly contacting sidewall surfaces of the bottom portion and a second section on and directly contacting top and sidewall surfaces of the top portion. The device also includes a gate structure over the dielectric layer and engaging the fin structure. The gate structure includes a high-k dielectric layer and a metal gate electrode over the high-k dielectric layer. The high-k dielectric layer directly contacts the first section of the interfacial layer.

In some embodiments, a distance between the top surface of the line layer and the bottom surface of the top portion along a first direction orthogonal to a top surface of the semiconductor substrate is about 1 nm to about 5 nm. In some embodiments, the liner layer includes silicon nitride. In some embodiments, the first material includes single crystal silicon (si) and the second material includes silicon germanium (SiGe). In some embodiments, the top portion is a channel region of a p-type transistor. In some embodiments, the fin structure is a first fin structure, and the device further includes a second fin structure. A top portion of the second fin structure is a channel region of an n-type transistor and includes the first material. In some embodiments, the bottom portion includes an anti-punch through (APT) region having an n-type dopant. The APT region interfaces with the top portion and with the first section of the interfacial layer. The first section of the interfacial layer interposes between the high-k dielectric layer and the APT region. In some embodiments, a top surface of the apt region is spaced way from the top surface of the liner layer.

In an exemplary aspect, the present disclosure is directed to a device. The device includes a semiconductor substrate, a fin structure over the semiconductor substrate, a liner layer on a sidewall of the fin structure, a dielectric layer over the semiconductor substrate and covering a top surface and a side surface of the liner layer, and a gate structure over the dielectric layer and engaging a channel portion of the fin structure.

In some embodiments, a portion of the dielectric layer interposes between and separates the gate structure and the liner layer. In some embodiments, the sidewall is a first sidewall of the fin structure and extends along a first direction substantially orthogonal to a top surface of the semiconductor substrate. The fin structure includes a second sidewall in a shoulder region of the fin structure adjacent the top surface of the liner layer. The second sidewall extends along a second direction. Moreover, the first direction and the second direction define an angle between 90 and 180. And, the shoulder region is embedded within the dielectric layer. In some embodiments, the channel portion connects a pair of source/drain features doped with a first dopant of a first conductivity type, and the fin structure includes an anti-punch through (APT) region adjacent the shoulder region. The APT region is doped with a second dopant of a second conductivity type opposite to the first conductivity type. In some embodiments, the fin structure includes a base fin portion below the channel portion. The base fin portion includes a first semiconductor material. And the channel portion includes a second semiconductor material different from the first semiconductor material. In some embodiments, the fin structure is a first fin structure. The device further includes a second fin structure. The second fin structure includes the same first semiconductor material extending throughout a height of the second fin structure. In some embodiments, the liner layer includes silicon nitride.

In an exemplary aspect, the present disclosure is directed to a method. The method includes receiving a semiconductor structure. The semiconductor structure includes a semiconductor substrate, a fin structure over the semiconductor substrate, a liner layer on a sidewall of the fin structure, and a first dielectric layer over the semiconductor substrate and on a side surface of the liner layer. The method also includes recessing the first dielectric layer and the liner layer to form a recessed first dielectric layer, a recessed liner layer, and to expose a first portion of the fin structure. The method further includes depositing a second dielectric layer over the first dielectric layer and over the trimmed fin structure. The second dielectric layer has a top surface extending over a top surface of the trimmed fin structures. Moreover, the method includes recessing the second dielectric layer to expose a second portion of the trimmed fin structures. The recessed second dielectric layer has a top surface extending over a top surface of the recessed liner layer and below a top surface of the trimmed fin structure. The method additionally includes forming a gate structure over the recessed second dielectric layer and the trimmed fin structures, such that the gate structure engages with a channel portion of the fin structure.

In some embodiments, the trimmed fin structure has a first height defined by a distance between a top surface of the recessed liner layer and the top surface of the trimmed fin structure. The second dielectric layer includes a portion having a second height defined by a distance between the top surface of the trimmed fin structure and the top surface of the second dielectric layer. Moreover, a ratio of the second height to the first height is greater than 0.5. In some embodiments, the fin structure is a first fin structure. The first fin structure includes a base fin portion with a first material and the channel portion with a second material. The second material is different from the first material. Moreover, the base fin portion further includes a first anti-punch through (APT) region with a first dopant. Additionally, the received semiconductor structure further includes a second fin structure having the first material throughout a height of the second fin structure. The second fin structure includes a second APT region with a second dopant. And the first dopant and the second dopant have opposite conductivity types. In some embodiments, the method further includes trimming the exposed first portion of the fin structure to form a trimmed fin structure; and performing a chemical-mechanical polishing (CMP) process on the second dielectric layer. In some embodiments, the trimming of the exposed first portion of the fin structure forms a shoulder region adjacent to the top surface of the liner layer. The shoulder region includes a shoulder wall that spans an angle with the sidewall between 90° and 180°. Moreover, the recessing of the second dielectric layer includes maintaining the shoulder wall covered by the recessed second dielectric layer.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method comprising:
receiving a semiconductor structure including:
    a semiconductor substrate;
    a fin structure over the semiconductor substrate;
    a liner layer on a sidewall of the fin structure; and
    a first dielectric layer over the semiconductor substrate and on a side surface of the liner layer;
recessing the first dielectric layer and the liner layer to form a recessed first dielectric layer, a recessed liner layer, and to expose a first portion of the fin structure;
trimming the exposed first portion of the fin structure to form a trimmed fin structure;
depositing a second dielectric layer over the first dielectric layer and over the trimmed fin structure, the second dielectric layer having a top surface extending over a top surface of the trimmed fin structure;
recessing the second dielectric layer to expose a second portion of the trimmed fin structure, the recessed second dielectric layer having a top surface extending over a top surface of the recessed liner layer and below a top surface of the trimmed fin structure; and
forming a gate structure over the recessed second dielectric layer and the trimmed fin structure, such that the gate structure engages with a channel portion of the fin structure.

2. The method of claim 1, wherein:
the trimmed fin structure has a first height defined by a distance between a top surface of the recessed liner layer and the top surface of the trimmed fin structure,
the second dielectric layer includes a portion having a second height defined by a distance between the top surface of the trimmed fin structure and the top surface of the second dielectric layer, and
a ratio of the second height to the first height is greater than 0.5.

3. The method of claim 1, wherein:
the fin structure is a first fin structure, and includes a base fin portion with a first material and the channel portion with a second material different from the first material, the base fin portion further including a first anti-punch through (APT) region with a first dopant;
the received semiconductor structure further includes a second fin structure having the first material throughout a height of the second fin structure, the second fin structure including a second APT region with a second dopant; and
the first dopant and the second dopant have opposite conductivity types.

4. The method of claim 3, wherein after the recessing of the first dielectric layer and the liner layer, the liner layer extends vertically to a top surface of the first APT region.

5. The method of claim 1, further comprising:
performing a chemical-mechanical polishing (CMP) process on the second dielectric layer to form a leveled second dielectric layer,
wherein the recessing of the second dielectric layer includes recessing the leveled second dielectric layer.

6. The method of claim 1, wherein the trimming of the exposed first portion of the fin structure forms a shoulder region adjacent to the top surface of the recessed liner layer, the shoulder region including a shoulder wall that spans an angle with the sidewall between 90° and 180°.

7. The method of claim 6, wherein the recessing of the second dielectric layer includes maintaining the shoulder wall to be covered by the recessed second dielectric layer.

8. The method of claim 1, wherein the liner layer is conformally deposited in a blanket deposition process.

9. The method of claim 8, wherein receiving a semiconductor structure further includes receiving a second liner layer between the liner layer and the sidewall of the fin structure.

10. A method comprising:
receiving a semiconductor structure including:
a semiconductor substrate;
a fin structure over the semiconductor substrate, the fin structure having a base portion, an anti-punch through (APT) region over the base portion, and a channel portion over the APT region;
a liner layer on a sidewall of the fin structure; and
a first dielectric layer over the semiconductor substrate and on a side surface of the liner layer;
recessing the first dielectric layer and the liner layer to form a recessed first dielectric layer, a recessed liner layer, and to expose the channel portion of the fin structure;
trimming the exposed channel portion of the fin structure to form a trimmed fin structure;
depositing a second dielectric layer over the first dielectric layer and over the trimmed fin structure, the second dielectric layer having a top surface extending over a top surface of the trimmed fin structure;
recessing the second dielectric layer to expose a second portion of the trimmed fin structure, the recessed second dielectric layer having a top surface extending over a top surface of the recessed liner layer and below a top surface of the trimmed fin structure; and
forming a gate structure over the recessed second dielectric layer and the trimmed fin structure, such that the gate structure engages with a channel region of the trimmed fin structure.

11. The method of claim 10, further comprising:
before recessing the second dielectric layer, performing a chemical-mechanical polishing (CMP) process on the second dielectric layer.

12. The method of claim 11, further comprising:
forming a capping layer over the trimmed fin structure; and
performing an annealing process on the trimmed fin structure.

13. The method of claim 12, wherein the gate structure includes a gate dielectric layer directly contacting the capping layer and the recessed second dielectric layer.

14. The method of claim 10, wherein after the recessing of the first dielectric layer and the liner layer, the liner layer extends vertically to a top surface of the APT region.

15. The method of claim 14, wherein after the recessing of the first dielectric layer and the liner layer, the liner layer extends vertically to a bottom surface of the channel portion.

16. The method of claim 14, wherein the trimming of the exposed channel portion forms a shoulder region on the top surface of the APT region, the shoulder region including a shoulder wall that spans an angle with the sidewall between 90° and 180°.

17. The method of claim 10, wherein the base portion includes bulk silicon, and the channel portion includes silicon germanium.

18. A method comprising:
receiving a semiconductor structure including:
a semiconductor substrate;
a fin structure over the semiconductor substrate, the fin structure having a base portion, a channel portion, and an anti-punch through (APT) region between the base portion and channel portion;
a liner layer on a sidewall of the fin structure; and
a dielectric layer over the semiconductor substrate and on a side surface of the liner layer;
recessing the dielectric layer and the liner layer to form a recessed dielectric layer, a recessed liner layer, and to expose a first portion of the fin structure, the exposed first portion including the channel portion and a section of the APT region;
trimming the exposed first portion of the fin structure to form a trimmed fin structure; and
forming a gate structure over the recessed dielectric layer and the trimmed fin structure, such that the gate structure engages with a channel region of the trimmed fin structure,
wherein a bottom surface of the channel portion is above a top surface of the recessed liner layer along a first direction orthogonal to a surface of the substrate.

19. The method of claim 18, wherein the forming of the gate structure includes forming a capping layer directly contacting the channel portion and directly contacting the section of the APT region, wherein the capping layer is above the recessed liner layer along the first direction.

20. The method of claim 19, wherein the trimming of the exposed first portion forms a shoulder surface in the APT region, the shoulder surface and a sidewall of the APT region spans an angle greater than 90°.

* * * * *